(12) United States Patent
Takizawa et al.

(10) Patent No.: US 12,215,528 B2
(45) Date of Patent: Feb. 4, 2025

(54) ELECTROSTATIC INPUT DEVICE AND DOOR HANDLE SENSOR SYSTEM

(71) Applicant: ALPS ALPINE CO., LTD., Tokyo (JP)

(72) Inventors: Satoru Takizawa, Miyagi (JP); Masaru Komatsu, Miyagi (JP); Kazuhito Oshita, Miyagi (JP); Manabu Tenjin, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 235 days.

(21) Appl. No.: 18/052,986

(22) Filed: Nov. 7, 2022

(65) Prior Publication Data

US 2023/0067991 A1 Mar. 2, 2023

Related U.S. Application Data

(63) Continuation of application No. PCT/JP2021/018870, filed on May 18, 2021.

(30) Foreign Application Priority Data

May 19, 2020 (JP) ................. 2020-087577

(51) Int. Cl.
E05B 81/76 (2014.01)
E05B 81/66 (2014.01)
(Continued)

(52) U.S. Cl.
CPC .............. *E05B 81/77* (2013.01); *E05B 81/66* (2013.01); *G07C 9/00182* (2013.01);
(Continued)

(58) Field of Classification Search
CPC .......... E05B 81/76; E05B 81/77; E05B 81/64; H03K 17/955; H03K 17/9612; H03K 17/9618

See application file for complete search history.

(56) References Cited

U.S. PATENT DOCUMENTS

2015/0325066 A1 11/2015 Muller
2016/0277023 A1* 9/2016 Nakajima .......... H03K 17/9625
2017/0194960 A1 7/2017 Bextermoeller et al.

FOREIGN PATENT DOCUMENTS

JP 2004-333302 11/2004
JP 2006-249672 9/2006
(Continued)

OTHER PUBLICATIONS

International Search Report for PCT/JP2021/018870 mailed on Aug. 17, 2021.

*Primary Examiner* — Benyam Haile
(74) *Attorney, Agent, or Firm* — IPUSA, PLLC

(57) ABSTRACT

In a door handle sensor system, a door handle device includes an electrostatic sensor to detect the user with respect to a door handle, and a pressure sensor to detect the operating force applied to the door handle. A control device determines whether the position of an operation is in a first end section, a second end section, or a center section of the door handle, and controls an unlatched state based on the determination result and the value detected by the pressure sensor. The electrostatic sensor includes a first electrode including multiple first electrode parts and a second electrode including multiple second electrode parts arranged alternately with the first electrode parts. The first electrode part other than the endmost first electrode part in the first direction and the second electrode part other than the endmost second electrode part in the first direction are arranged in the center section.

6 Claims, 22 Drawing Sheets

(51) Int. Cl.
*G07C 9/00* (2020.01)
*H03K 17/955* (2006.01)
*H03K 17/96* (2006.01)

(52) U.S. Cl.
CPC . *H03K 17/955* (2013.01); *G07C 2009/00206* (2013.01); *H03K 2017/9613* (2013.01)

(56) References Cited

FOREIGN PATENT DOCUMENTS

| | | |
|---|---|---|
| JP | 2010-239587 | 10/2010 |
| JP | 2010239587 A * | 10/2010 |
| JP | 2016-173299 | 9/2016 |
| JP | 2017-524904 | 8/2017 |
| WO | 2019/139093 | 7/2019 |

* cited by examiner

|  | ELECTROSTATIC SENSOR 110 | ELECTROSTATIC SENSOR FOR COMPARISON 50 |
|---|---|---|
| OPERATION (2) | 1% | 30% |
| OPERATION (2.5) | 6% | 32% |
| OPERATION (3) | 10% | 13% |

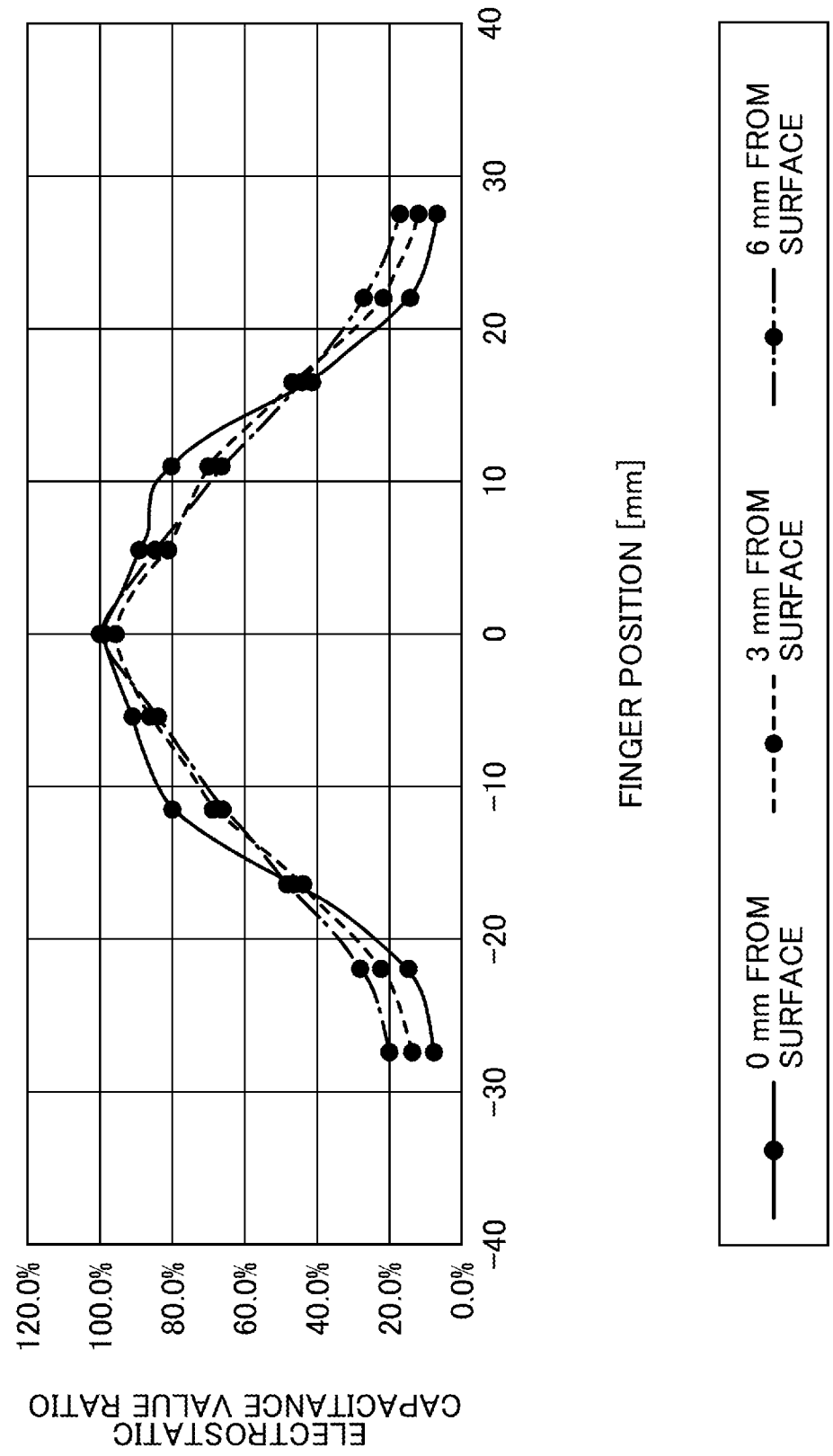

ELECTROSTATIC INPUT DEVICE AND DOOR HANDLE SENSOR SYSTEM

CROSS-REFERENCE TO RELATED APPLICATION

This application is a continuation application of International Application No. PCT/JP2021/018870, filed on May 18, 2021, and designated the U.S., which is based upon and claims priority to Japanese Patent Application No. 2020-087577, filed on May 19, 2020, the entire contents of which are incorporated herein by reference.

BACKGROUND OF THE INVENTION

1. Field of the Invention

The present invention relates to an electrostatic input device and a door handle sensor system.

2. Description of the Related Art

Conventionally, there is a touch sensor, in which the oblique sides of first and second electrodes, which are right-angled triangles that are equal to each other in plan view, are arranged so that the first and second electrodes form a rectangle as a whole (see Patent Document 1, for example).

RELATED-ART DOCUMENT

[Patent Document]
 [Patent Document 1] Unexamined Japanese Patent Application Publication No. 2004-333302

SUMMARY OF THE INVENTION

Technical Problem

Now, the above conventional touch sensor is designed to determine the position in the first axial direction (for example, the X direction) of the rectangle where an operation is performed, by using the two electrodes, that is, the first electrode and the second electrode. When an operation is performed in the first axial direction, the capacitance between one of the first electrode and the second electrode and the object that is targeted for detection such as a hand increases, and, furthermore, the capacitance between the other electrode and the object targeted for detection decreases. Then, by determining the proportion of one electrode to the sum of both electrodes, the position of the operation in the first axial direction (the X direction) can be determined even if the vertical distance from the electrodes varies slightly. Now, there is a demand to widen the width of the electrodes in a second axial direction (the Y direction) that is perpendicular to the first axial direction, for the purpose of, for example, increasing the output of these electrodes. In this case, even if an operation is performed in the second axial direction, the proportion of one electrode to the sum of both electrodes varies, and therefore the operation in the second axial direction may be misidentified as a movement toward the first axial direction, and the direction of movement and the amount of movement of the object targeted for detection in the first axial direction might not be specified accurately. Also, as a consequence of this, the position where the operation is performed may not be specified accurately.

An object is therefore to provide an electrostatic input device and a door handle sensor system that can accurately specify the position where an operation is performed.

Solution to Problem

According to an embodiment of the present invention, a door handle sensor system for mounting in a vehicle includes: a door handle device attached to a door of the vehicle; and a control device configured to control the unlatched state of the door,
  wherein the door handle device includes: an inner case provided inside an outer case provided outside the vehicle; an electrostatic sensor configured to detect the user coming close to, or contact with, the outer case or the inner case; and a pressure sensor configured to detect the operating force applied to the outer case or the inner case,
  wherein the control device includes a determining part configured to determine whether the position of an operation by the user is in a first end section, a second end section, or a center section of the outer case and the inner case, the center section being located between the first end section and the second end section,
  wherein the control device controls the unlatched state of the door based on the result of determination by the determining part and the value detected by the pressure sensor,
  wherein the electrostatic sensor includes: a first electrode including: a plurality of first electrode parts arranged at spaced intervals in a first direction, the first direction extending between the first end section and the second end section; and a first connecting part connecting between the plurality of first electrode parts on a first side in a second direction, the second direction being orthogonal to the first direction in plan view; a second electrode including: a plurality of second electrode parts arranged alternately with the plurality of first electrode parts in the first direction; and a second connecting part connecting between the plurality of second connecting parts on a second side in the second direction in plan view,
  wherein, of the plurality of first electrode parts, an endmost first electrode part is located on a side of the first end section in the first direction, and a first electrode part other than the endmost first electrode part is arranged in the center section, and
  wherein, of the plurality of second electrode parts, an endmost second electrode part is located on a side of the second end section in the first direction, and a second electrode part other than the endmost second electrode part is arranged in the center section.

Advantageous Effects of the Invention

It is therefore possible to provide an electrostatic input device and a door handle sensor system that can accurately specify the position where an operation is performed.

BRIEF DESCRIPTION OF THE DRAWINGS

FIG. 20 is a diagram showing the characteristics of the ratio of the self-capacitances of two electrodes versus the position of fingers in the X direction on the door handle.

DESCRIPTION OF THE PREFERRED EMBODIMENTS

Embodiments to which the electrostatic input device and the door handle sensor system of the present invention are applied will be described below.

Embodiment 1

Figure 1:
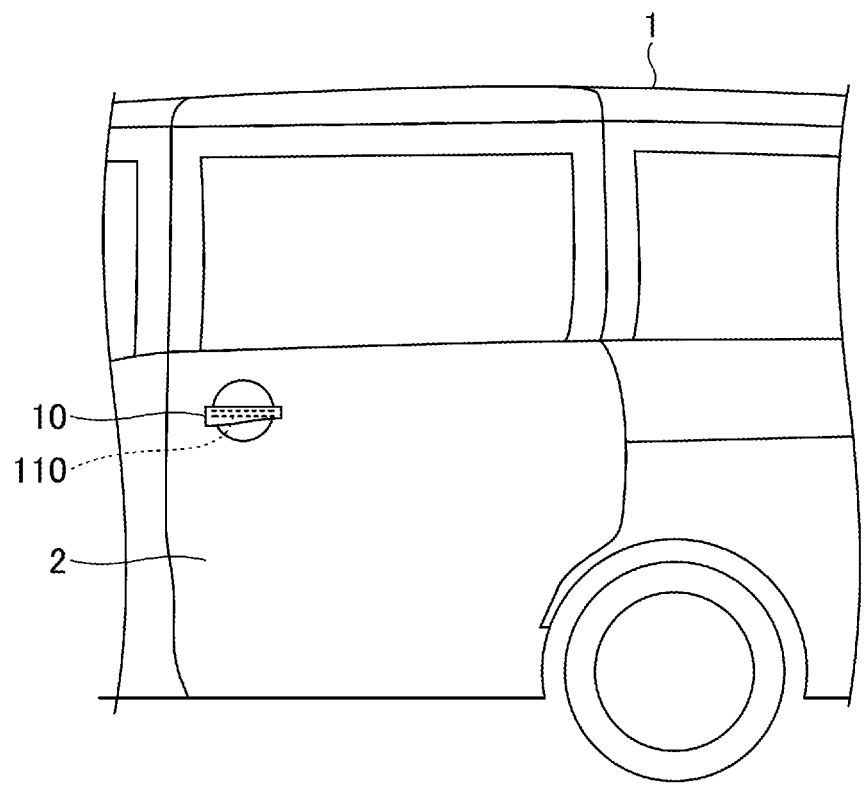
FIG. 1 is a diagram showing a door handle attached to a vehicle.

FIG. 1 shows a door handle 10 attached to a vehicle 1. The door handle 10 is attached to a door 2 of the vehicle 1. The door handle 10 has a long and narrow shape so that it can be easily held by human fingers or the like. An electrostatic sensor 110 is provided inside the door handle 10. Note that, in FIG. 1, the longitudinal direction of the door handle 10 is the lateral direction in which the door handle 10 extends long and narrow.

Figure 2:
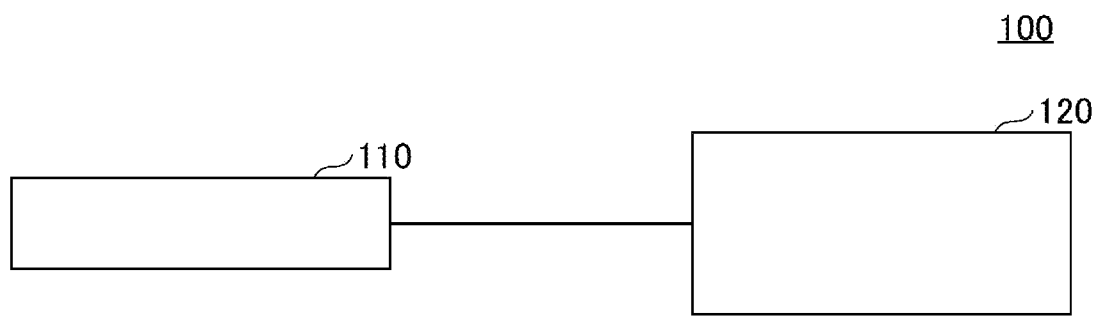
FIG. 2 is a diagram showing a configuration of an electrostatic input device.

FIG. 2 is a diagram showing the configuration of the electrostatic input device 100. The electrostatic input device 100 has an electrostatic sensor 110 and a position specifying part 120. Although FIG. 2 shows a simplified representation of the electrostatic sensor 110 and the position specifying part 120, the two electrodes of the electrostatic sensor 110 are connected to the position specifying part 120, and the position specifying part 120 specifies the position (operating position) on the first axis where the user's hand or the like touches the door handle 10, based on the ratio of the capacitances of the two electrodes. The position specifying part 120 has an amplifier, an ADC (Analog-to-Digital Converter), an arithmetic part, a control part, and so forth, but these are omitted here.

Figure 3:
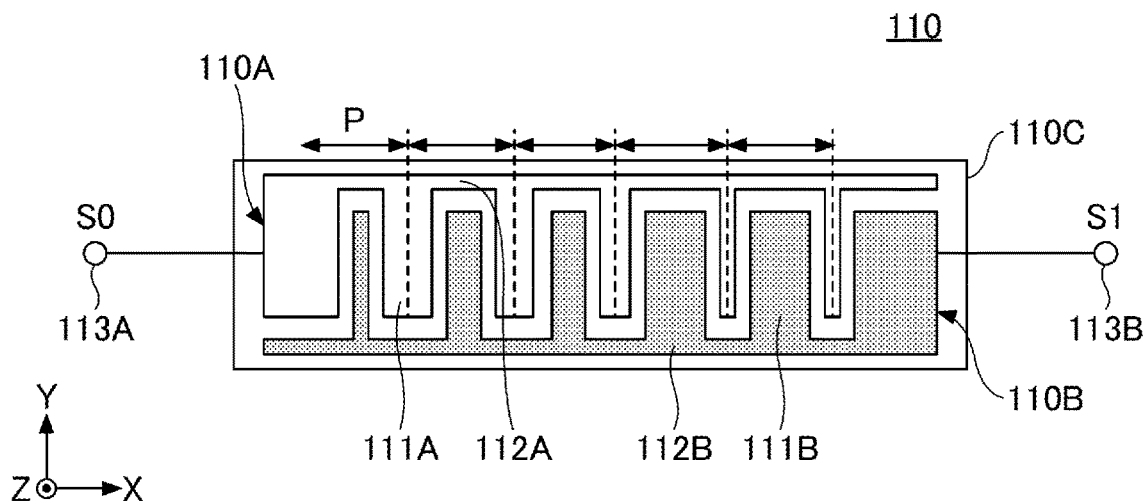
FIG. 3 is a diagram showing an electrostatic sensor.

FIG. 3 is a diagram showing the electrostatic sensor 110. The electrostatic sensor 110 has an electrode 110A, an electrode 110B, and a substrate 110C. The electrode 110A is an example of the first electrode, and the electrode 110B is an example of the second electrode. The electrodes 110A and 110B both have a comb-like shape. An XYZ coordinate system will be defined and explained below. Also, hereinafter, "plan view" will mean XY plane view, and, although, for ease of explanation, the −Z direction side will be referred to as "the lower side" or "below," and the +Z direction side will be referred to as "the upper side" or "above," these do not represent the universally accepted concept of verticality. Note that the X axis corresponds to the first axis.

The electrode 110A has a plurality of electrode parts 111A and a connecting part 112A, and a terminal 113A is connected. For example, three or more electrode parts 111A may suffice, and FIG. 3 shows six electrode parts 111A. The reason that three or more electrode parts 111A suffice is that, since the electrostatic sensor 110 detects the position of an operation in the X direction based on changes in the capacitances of the electrode parts 111A and the electrode parts 111B, which are arranged alternately in the X direction, it then follows that providing at least three electrode parts 111A is sufficient.

The electrode parts 111A are examples of a plurality of first electrode parts, all having different widths in the X direction and equal lengths in the Y direction. Also, these multiple electrode parts 111A each have a rectangular shape that is long and narrow in the Y direction, and formed such that the width of the electrode is uniform in the Y direction. The electrode parts 111A each have a rectangular shape with two sides extending in the Y direction. The electrode part 111A located furthest in the −X direction has the widest width in the X direction, and the electrode part 111A located furthest in the +X direction has the narrowest width in the X direction. The widths of the electrode parts 111A in the X direction are configured so as to be narrower in order from the −X direction to the +X direction in the X direction. Therefore, the electrode part 111A located furthest in the −X direction has the largest area in the X direction, and the electrode part 111A located furthest in the +X direction has the smallest area in the X direction. Note that the pitches P of the electrode parts 111A are all equal in the X direction.

A pitch P is the distance between the widthwise centers of neighboring electrode parts 111A in the X direction.

These multiple electrode parts 111A are arranged alternately (succeeding by turns) with a plurality of electrode parts 111B of the electrode 110B in the X direction, which is an example of a predetermined direction, and arranged at overlapping positions in the Y direction. The interval between adjacent electrode parts 111A and 111B in the X direction may be configured such that capacitive coupling occurs between at least one of the electrode parts 111A and 111B and fingers, regardless of where in the X direction the fingers are positioned. Such an interval is, for example, 0.5 mm or less, and 0.5 mm is a value obtained by a simulation.

The connecting part 112A is an example of the first connecting part, and is a linear pattern that connects between the +Y end parts of the electrode parts 111A in the X direction. The width of the connecting part 112A in the Y direction is constant in the X direction. Because a plurality of electrode parts 111A are connected to the −Y direction side of the connecting part 112A that extends in the X direction, the electrode 110A has a comb-like shape in plan view. Such an electrode 110A can be produced, for example, by patterning a metal foil such as a copper foil provided on the upper surface of the substrate 110C by etching or the like.

The electrode 110B has a comb-like shape that is nested with the comb-like shape of the electrode 110A. The electrode 110B has a plurality of electrode parts 111B and a connection part 112B, and a terminal 113B is connected. Similar to the electrode part 110A, the number of electrode parts 111B has only to be three or more, for example.

A plurality of electrode parts 111B are examples of a plurality of second electrode parts, and arranged such that the alignment of the electrode parts 111A is inverted in the X direction. The electrode parts 111B have varying widths in the X direction and equal lengths in the Y direction. Also, these multiple electrode parts 111A each have a rectangular shape that is long and narrow in the Y direction, and formed such that the width of the electrode is uniform in the Y direction. The electrode parts 111B each have a rectangular shape with two sides extending in the Y direction. The electrode part 111B located furthest in the −X direction has the narrowest width in the X direction, and the electrode part 111B located furthest in the +X direction has the widest width in the X direction. The widths of the electrode parts 111B in the X direction are configured so as to be wider in order from the −X direction to the +X direction in the X direction. Therefore, the electrode part 111B located furthest in the −X direction has the smallest area in the X direction, and the electrode part 111B located furthest in the +X direction has the largest area in the X direction. Note that, similar to the electrode parts 111A again, the pitches P of the electrode parts 111B in the X direction are the same.

The connecting part 112B is an example of the second connecting part, and is a linear pattern that connects between the −Y end parts of a plurality of electrode parts 111B in the X direction. The connecting part 112B extending in the Y direction has a constant width in the X direction. Because a plurality of electrode parts 111B are connected to the +Y direction side of the connecting part 112B that extends in the X direction, the electrode 110B has a comb-like shape in plan view. Such an electrode 110B can be produced, for example, by patterning a metal foil such as a copper foil provided on the upper surface of the substrate 110C by etching or the like.

Note that, although an example will be described here in which a plurality of electrode parts 111A and 111B extend in a direction orthogonal to the connecting parts 112A and 112B in plan view, the electrode parts 111A and 111B may extend in directions not at right angles with the connecting parts 112A and 112B in plan view (for example, at an angle less than 90 degrees, an angle greater than 90 degrees, etc.), and may even have a curved shape in plan view.

The substrate 110C is, for example, a wiring substrate conforming to FR4 (Flame Retardant type 4) standard. The electrodes 110A and 110B are formed on the top surface of the substrate 110C as an example. Note that the substrate 110C may be a flexible substrate, and the electrodes 110A and 110B may be formed on the top and bottom surfaces of the substrate 110C, respectively. Also, the electrodes 110A and 110B may be formed on two substrates, separately, and the two substrates may be stacked by insulting the electrodes 110A and 110B from each other.

Figure 4:
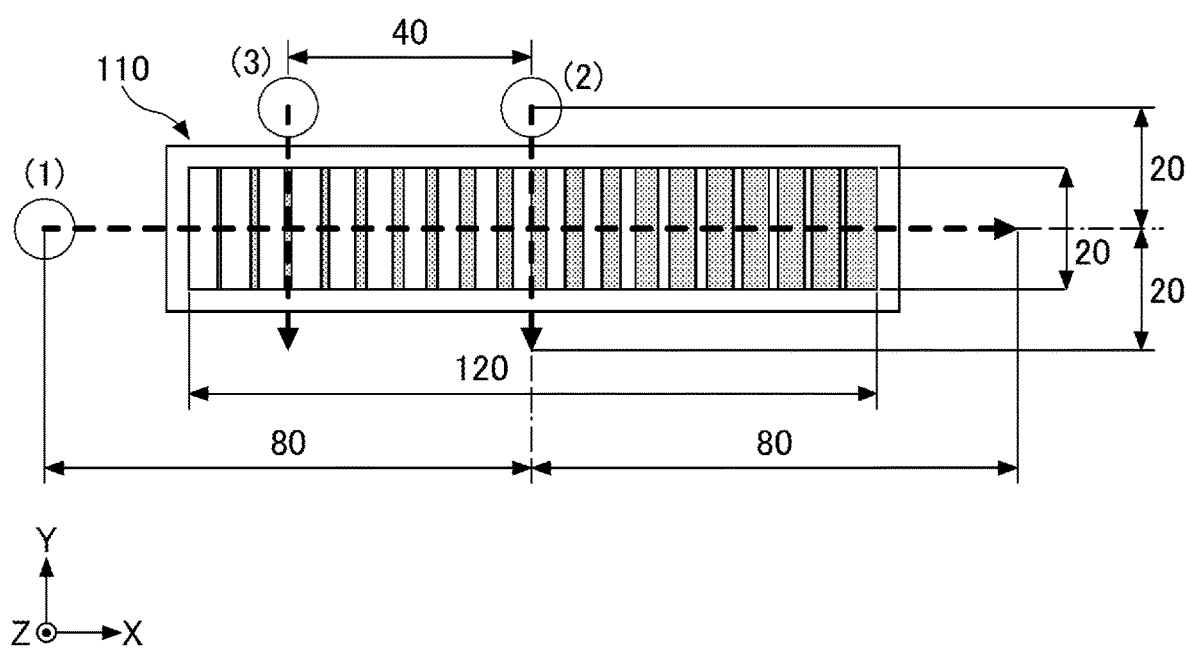
FIG. 4 is a diagram showing an example of an electrostatic sensor simulation model.

FIG. 4 is a diagram showing an example of a simulation model of the electrostatic sensor 110. FIG. 4 shows only codes pertaining to the electrostatic sensor 110, and relies on FIG. 3 for codes pertaining to the electrodes 110A and 110B and the electrode parts 111A and 111B. The simulation model shown in FIG. 4 includes 19 electrode parts 111A and 111B each. Also, the electrodes 110A and 110B are 120 mm long in the X direction, and 20 mm wide in the Y direction.

Based on such a simulation model of the electrostatic sensor 110, operations (1) to (3) are performed by using a finger jig simulating human fingers. For example, the position of the finger jig may be 60 mm above the electrostatic sensor 110, and a simulation was performed assuming that operations (1) to (3) were performed while touching on a door handle 10 (see FIG. 1). Such operations are known as "swipe operations."

In operation (1), the finger jig is moved from the position 80 mm in the −X direction from the X-direction center of the electrostatic sensor 110, to the position of +80 mm, and this is equivalent to an operation of moving fingers in the longitudinal direction (X direction) of the door handle 10. In operation (2), the finger jig is moved from the position +20 mm from the center of the electrostatic sensor 110 in the Y-direction, to the position of −20 mm, at the center of the electrostatic sensor 110 in the X direction. In operation (3), the finger jig is moved from the position +20 mm from the center of the electrostatic sensor 110 in the Y direction, to the position of −20 mm, at the position −40 mm from the center of the electrostatic sensor 110 in the X-direction. Note that the circles shown at the starting points of operation (1) to (3) indicate the starting points of the finger jig, and the simulation was performed assuming that the fingers were cylindrical and had a diameter of 12 mm as an example. Also, as an operation (2.5), an operation to move the finer jig, at the position −20 mm from the center of the electrostatic sensor 110 in the X direction, which is an intermediate position between operation (2) and operation (3), from the position +20 mm from the center of the electrostatic sensor 110 in the Y direction, to the position of −20 mm was also performed.

Figure 5A:
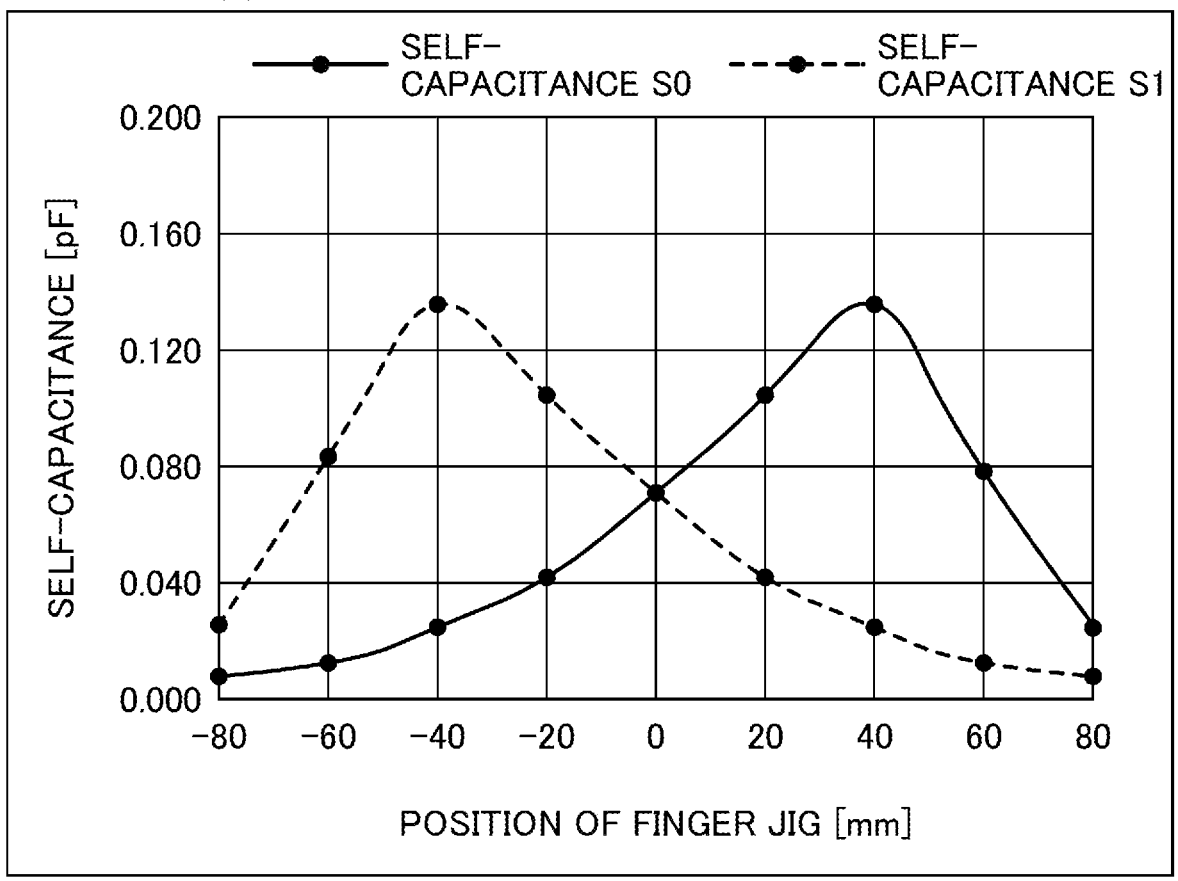
FIG. 5A is a diagram showing the characteristics of self-capacitances S0 and S1 versus the position of a finger jig when an operation (1) is performed.
Figure 5B:
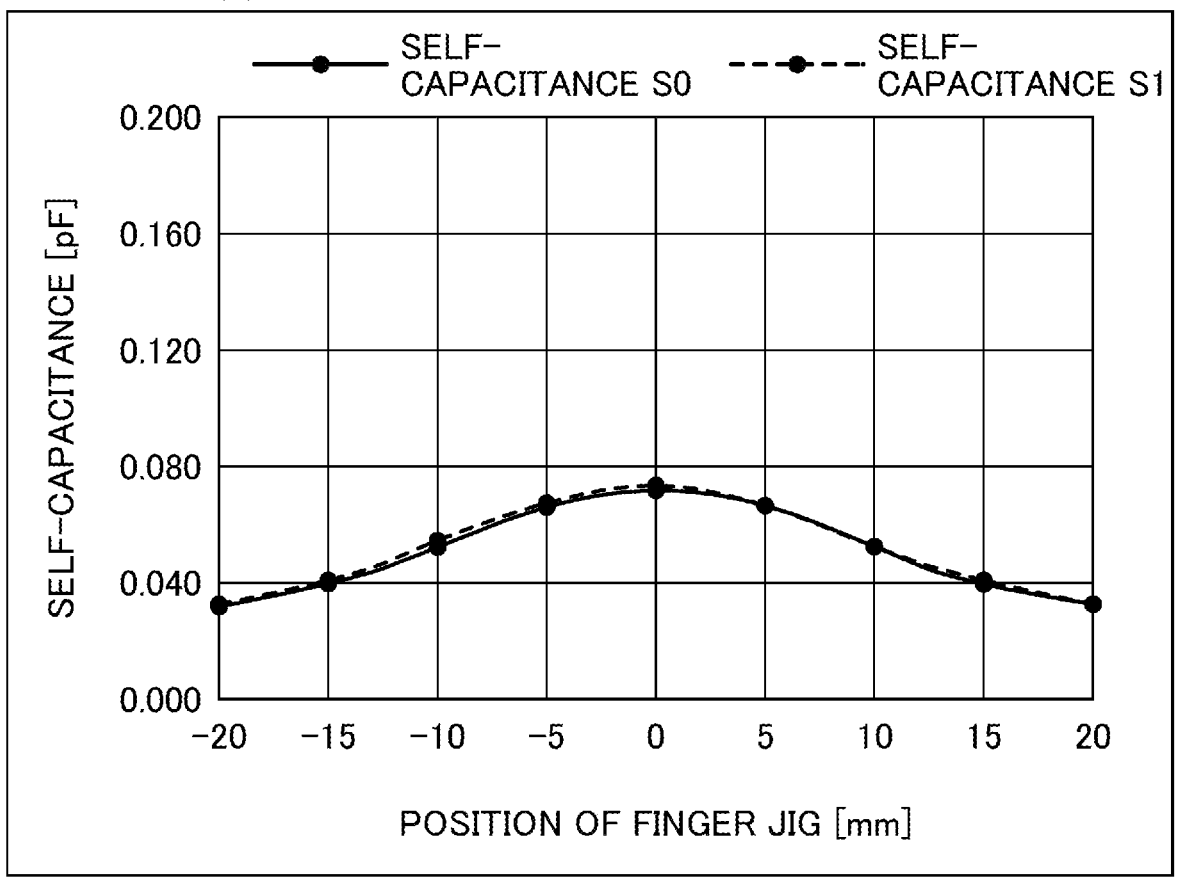
FIG. 5B is a diagram showing the characteristics of self-capacitances S0 and S1 versus the position of the finger jig when an operation (2) is performed.

FIG. 5A shows the characteristics of self-capacitances S0 and S1 versus the position of the finger jig when operation (1) was performed. FIG. 5B shows the characteristics of self-capacitances S0 and S1 versus the position of the finger jig when operation (2) was performed. Self-capacitances S0 and S1 are the capacitances (pF) obtained based on the potentials of terminals 113A and 113B of the self-capacitive electrostatic sensor 110, respectively.

As shown in FIG. 5A, when operation (1) was performed, self-capacitance S0 showed a characteristic in which self-capacitance S0 took the maximum value at −40 mm from the center in the X direction, and self-capacitance S1 showed a characteristic in which self-capacitance S1 took the maximum value at +40 mm from the center in the X direction. Thus, self-capacitances S0 and S1 exhibited symmetrical characteristics across the X-axis direction. Also, as shown in FIG. 5B, when operation (2) was performed, self-capacitances S0 and S1 exhibited substantially the same characteristic, in which self-capacitances S0 and S1 took the maximum value when the finger jig's position was at 0 mm, which is the center in the Y direction. In this way, self-capacitances S0 and S1 exhibited completely different characteristics in operations (1) and (2), and thus made it possible to distinguish between operations in the X direction and the Y direction. Note that the characteristic when operation (3) was performed showed a similar tendency to operation (2).

Figure 6A:
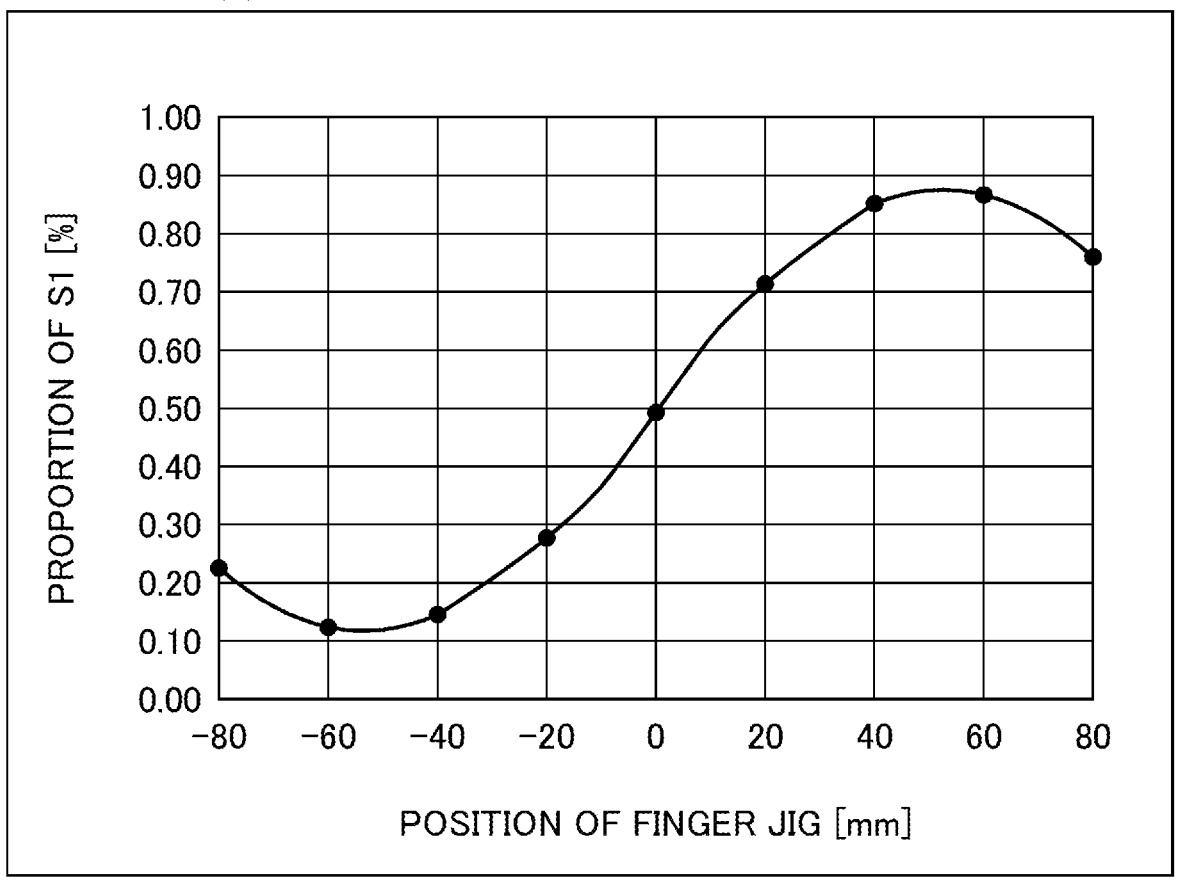
FIG. 6A is a diagram showing the characteristic of the proportion of self-capacitance S1 versus the position of the finger jig when operation (1) is performed.
Figure 6B:
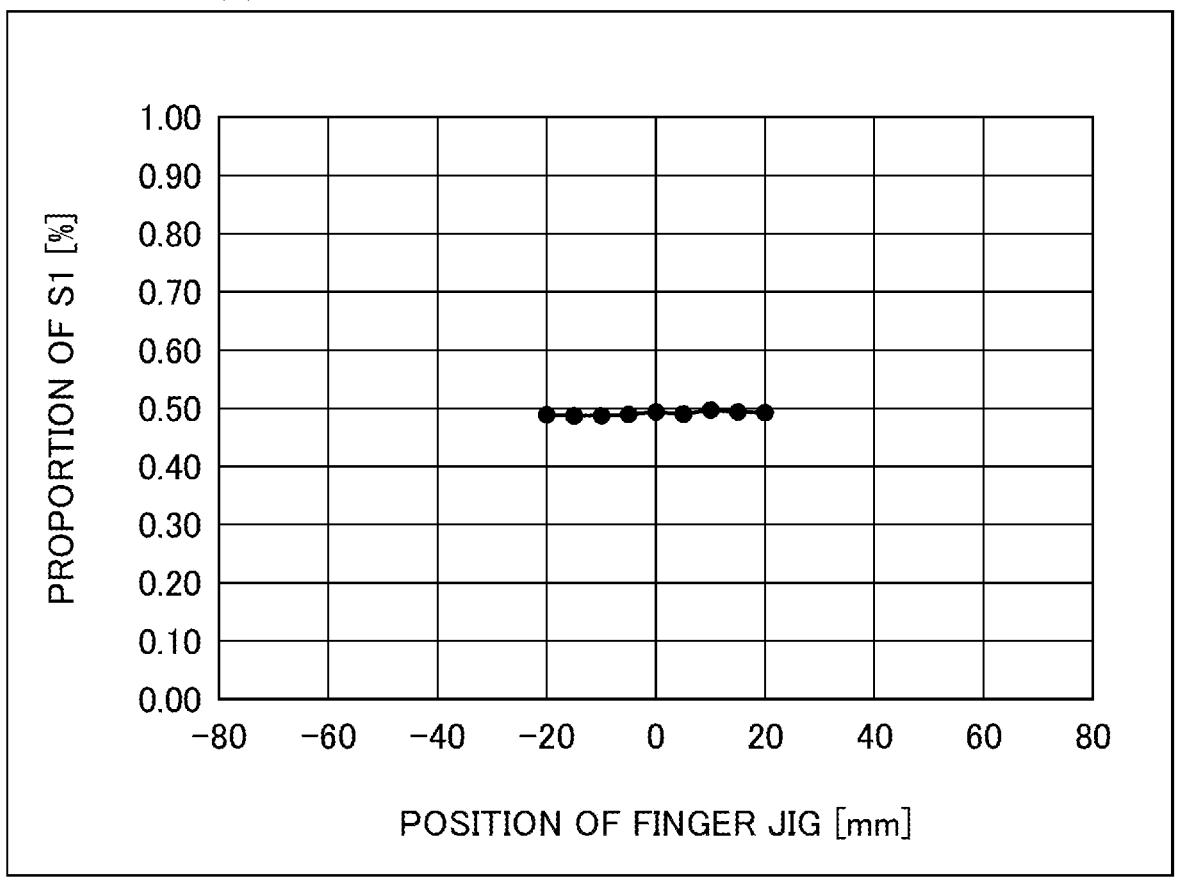
FIG. 6B is a diagram showing the characteristic of the proportion of self-capacitance S1 versus the position of the finger jig when operation (2) is performed.

FIG. 6A is a diagram showing the characteristic of the proportion of self-capacitance S1 versus the position of the finger jig when operation (1) was performed. FIG. 6B is a diagram showing the characteristic of the proportion of self-capacitance S1 versus the position of the finger jig when operation (2) was performed. The proportion of self-capacitance S1 is a value representing S1/(S0+S1) as a percentage (%).

As shown in FIG. 6A, when operation (1) is performed, the proportion of self-capacitance S1 exhibits good values from −60 mm to +60 mm with respect to the center in the X direction. The absolute value of the proportion of self-capacitance S1 decreases beyond −60 mm in the −X direction and beyond +60 mm in the +X direction, but these are sections where the electrodes 110A and 110B do not exist. Therefore, the electrostatic sensor 110 can detect the position of the finger jig in the X direction, in the range of −60 mm to +60 mm, by associating proportions and positions in the X direction in advance by using an arithmetic expression or a comparative table.

As shown in FIG. 6B, when operation (2) was performed, the proportion of self-capacitance S1 was substantially constant in the range of −20 mm to +20 mm from the center in the Y direction. In this way, the proportion of self-capacitance S1 exhibited completely different characteristics in operations (1) and (2), and thus made it possible to distinguish between operations in the X direction and operations in the Y direction. Then, in operation (2), since the proportion does not change, it is not determined that the operation is performed in the X direction. Note that the characteristic when operation (3) was performed showed a similar tendency to operation (2). This is likely to be because each electrode has a shape with two sides extending in the Y direction, and therefore, even if the finger jig is moved in the Y direction, the distance between the finger jig and each electrode's portion that capacitively couples with the finger jig, and their area, change little. Note that, here, each electrode has a rectangular shape with two sides extending in the Y direction, but any shape may be applicable here as long as long as it has two sides that extend in the Y direction, and, for example, a shape in which the end parts in the Y direction are round may be used.

Figure 7:
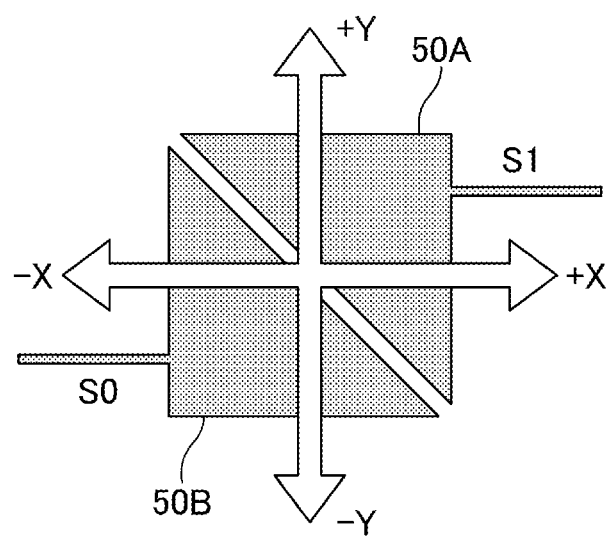
FIG. 7 is a diagram showing an electrostatic sensor for comparison.

FIG. 7 shows an electrostatic sensor 50 for comparison. In the electrostatic sensor 50, the oblique sides of electrodes 50A and 50B, which are right-angled triangles that are equal to each other in plan view, are arranged so that the electrodes 50A and 50B form a rectangle as a whole. As for the dimensions, similar to the example of the first simulation model shown in FIG. 4, the electrodes 50A and 50B are 120 mm long in the X direction and 20 mm wide in the Y direction, and a simulation was performed accordingly.

Here, when using the electrostatic sensor 50 for comparison, in operation (1), the finger jig is moved in the −X direction, from the center of the electrostatic sensor 50 in the X direction. In operation (2), the finger jig is moved from the +Y direction side to the −Y direction side of the electrostatic sensor 50, at the center of the electrostatic sensor 50 in the X direction.

Figure 8A:
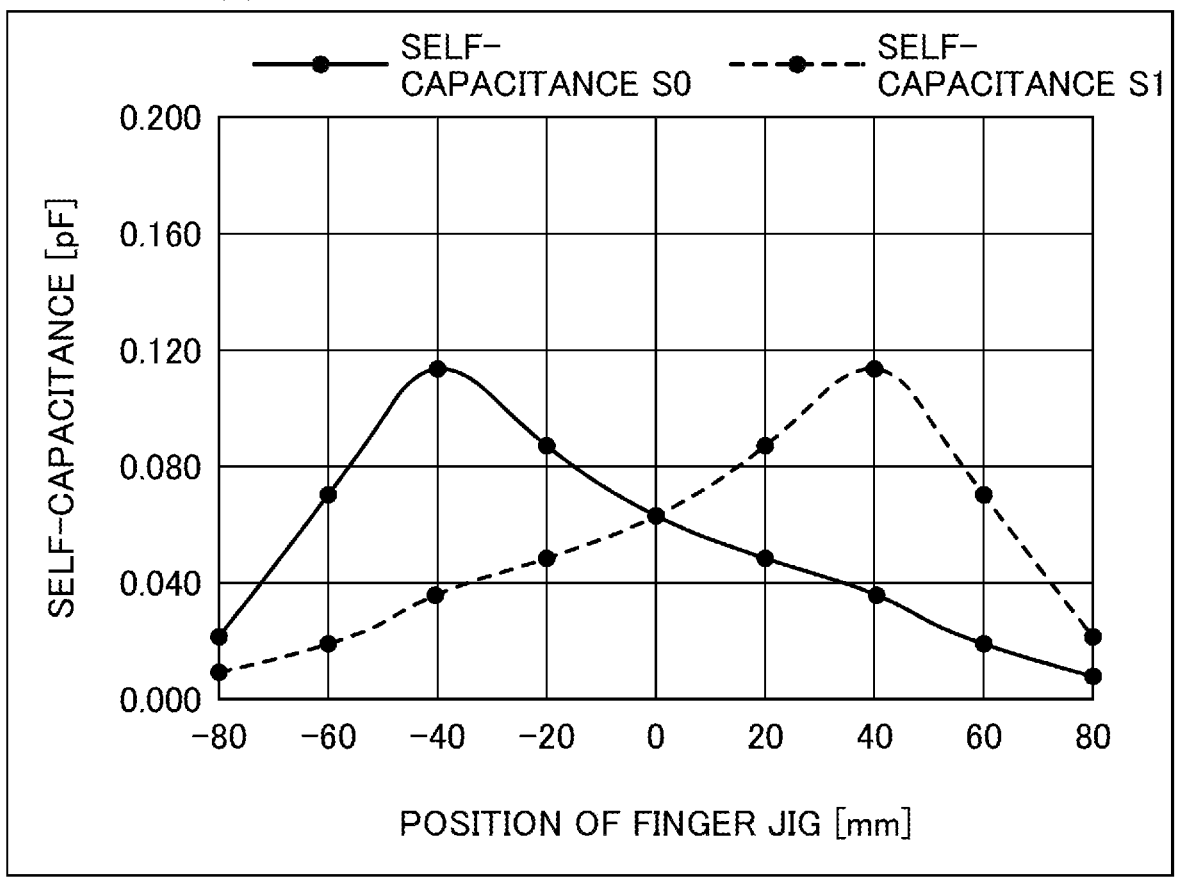
FIG. 8A is a diagram showing the characteristics of self-capacitances S0 and S1 versus the position of the finger jig when operation (1) is performed.
Figure 8B:
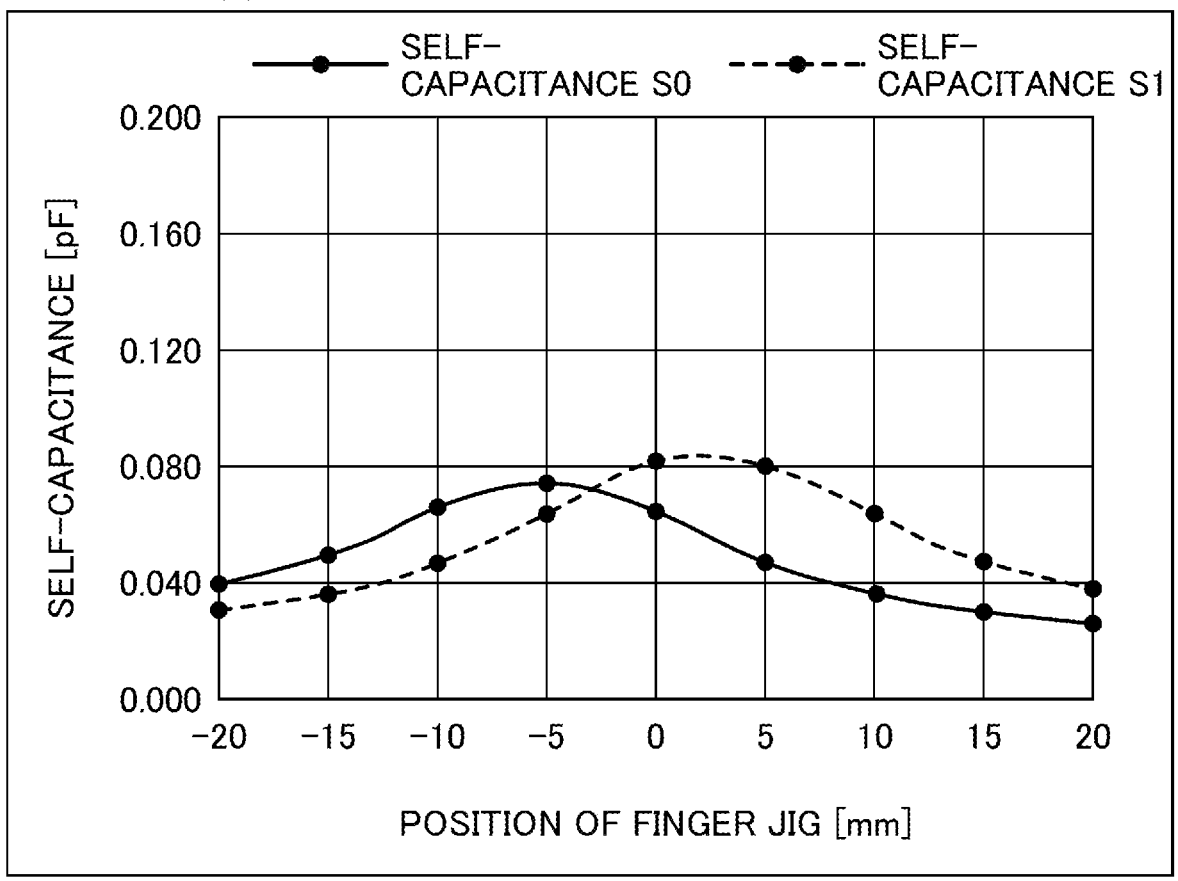
FIG. 8B is a diagram showing the characteristics of self-capacitances S0 and S1 versus the position of the finger jig when operation (2) is performed.

FIG. 8A shows the characteristics of self-capacitances S0 and S1 versus the position of the finger jig when operation (1) was performed. FIG. 8B shows the characteristics of self-capacitances S0 and S1 versus the position of the finger jig when operation (2) was performed. Self-capacitances S0 and S1 are the capacitances (pF) obtained based on the potentials of the electrodes 50A and 50B, respectively.

As shown in FIG. 8A, when operation (1) was performed, self-capacitance S0 showed a characteristic in which self-capacitance S0 took the maximum value at −40 mm from the center in the X direction, and self-capacitance S1 showed a characteristic in which self-capacitance S1 took the maximum value at +40 mm from the center in the X direction. Thus, self-capacitances S0 and S1 exhibited symmetrical characteristics across the X-axis direction. Also, as shown in FIG. 8B, when operation (2) was performed, self-capacitance S0 showed a characteristic in which self-capacitance S0 took the maximum value when the finger jig's position was −5 mm from the center in the Y direction, and self-capacitance S1 showed a characteristic in which self-capacitance S1 took the maximum value the finger jig's position was in the range of +5 mm from the center in the X direction. Thus, self-capacitances S0 and S1 exhibited symmetrical characteristics in the Y-axis direction. It is therefore clear from the comparison of FIG. 8A and FIG. 8B that self-capacitances S0 and S1 exhibit symmetrical characteristics in operation (1) and operation (2), making it difficult to distinguish between these operations.

Figure 9A:
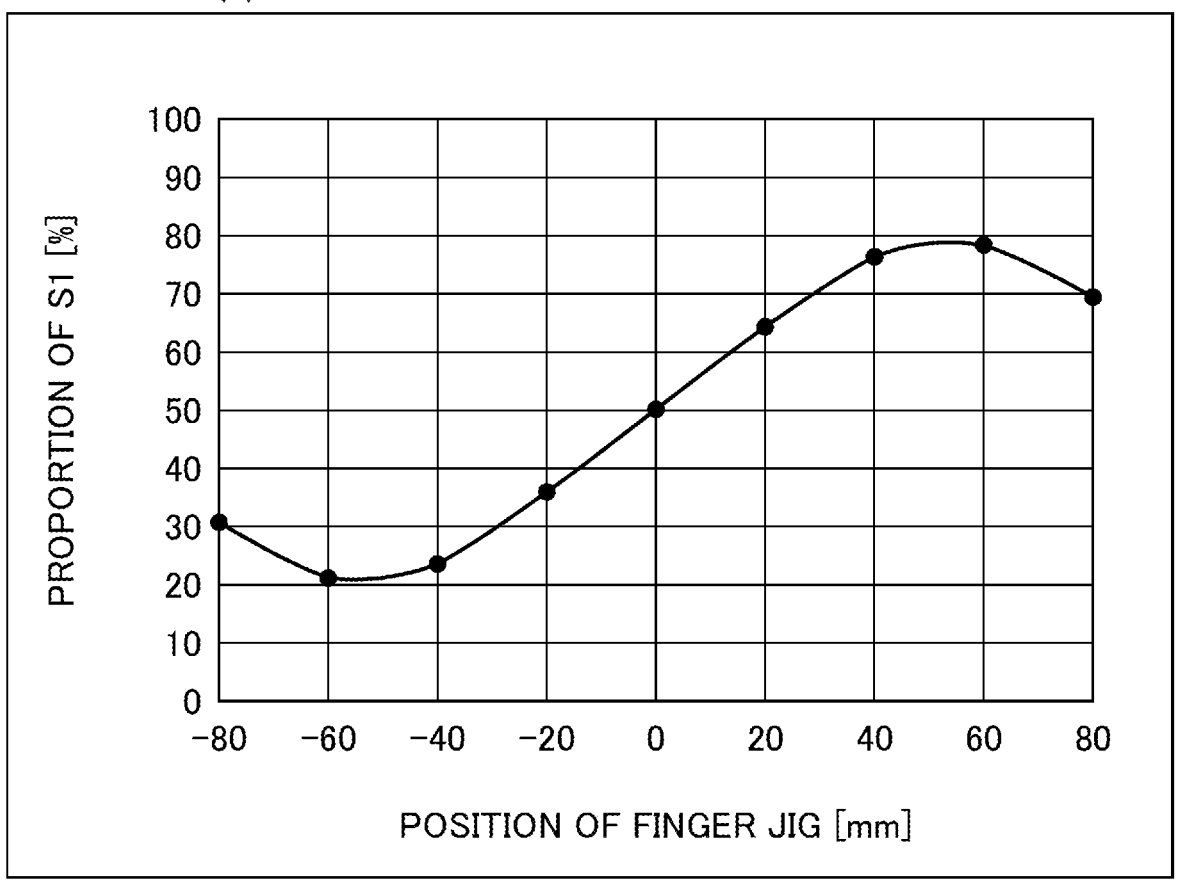
FIG. 9A is a diagram showing the characteristic of the proportion of self-capacitance S1 versus the position of the finger jig when operation (1) is performed.
Figure 9B:
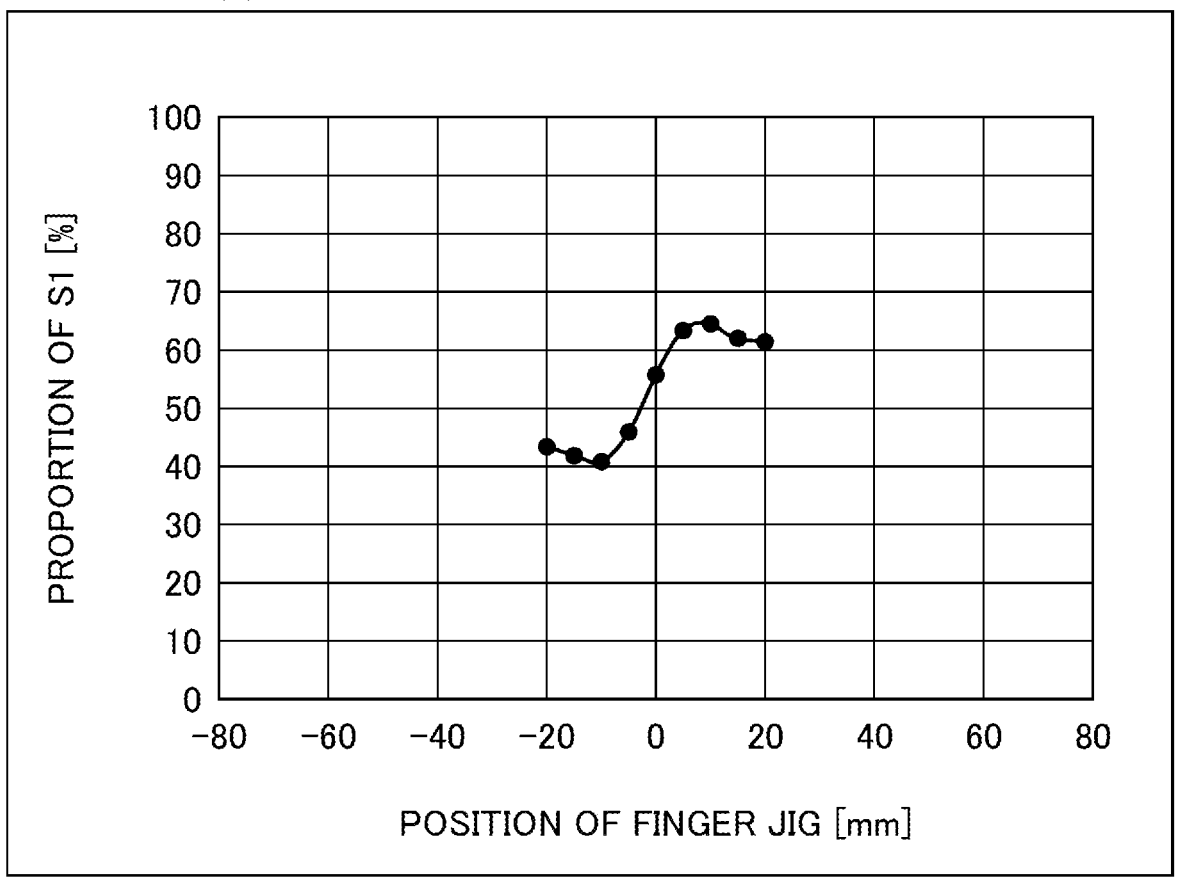
FIG. 9B is a diagram showing the characteristic of the proportion of self-capacitance S1 versus the position of the finger jig when operation (2) is performed.

FIG. 9A is a diagram showing the characteristic of the proportion of self-capacitance S1 versus the position of the finger jig when operation (1) was performed. FIG. 9B is a diagram showing the characteristic of the proportion of self-capacitance S1 versus the position of the finger jig when operation (2) was performed. The proportion of self-capacitance S1 is a value representing S1/(S0+S1) as a percentage (%).

As shown in FIG. 9A, when operation (1) is performed, the proportion of self-capacitance S1 exhibits good values from −60 mm to +60 mm with respect to the center in the X direction. The absolute value of the proportion of self-capacitance S1 decreases beyond −60 mm in the −X direction and beyond +60 mm in the +X direction, but these are sections where the electrodes 50A and 50B do not exist. Therefore, the electrostatic sensor 50 can detect the position of the finger jig in the X direction, in the range of −60 mm to +60 mm, by associating proportions and positions in the X direction in advance by using an arithmetic expression or a comparative table.

As shown in FIG. 9B, when operation (2) was performed, the proportion of self-capacitance S1 varied significantly in the range of −20 mm to +20 mm from the center in the Y direction. In particular, the change around the center (0 mm) in the Y direction was very large, where a change of approximately 30% was observed. It was confirmed that this was a characteristic similar to the characteristic shown in FIG. 9A.

Figure 10A:
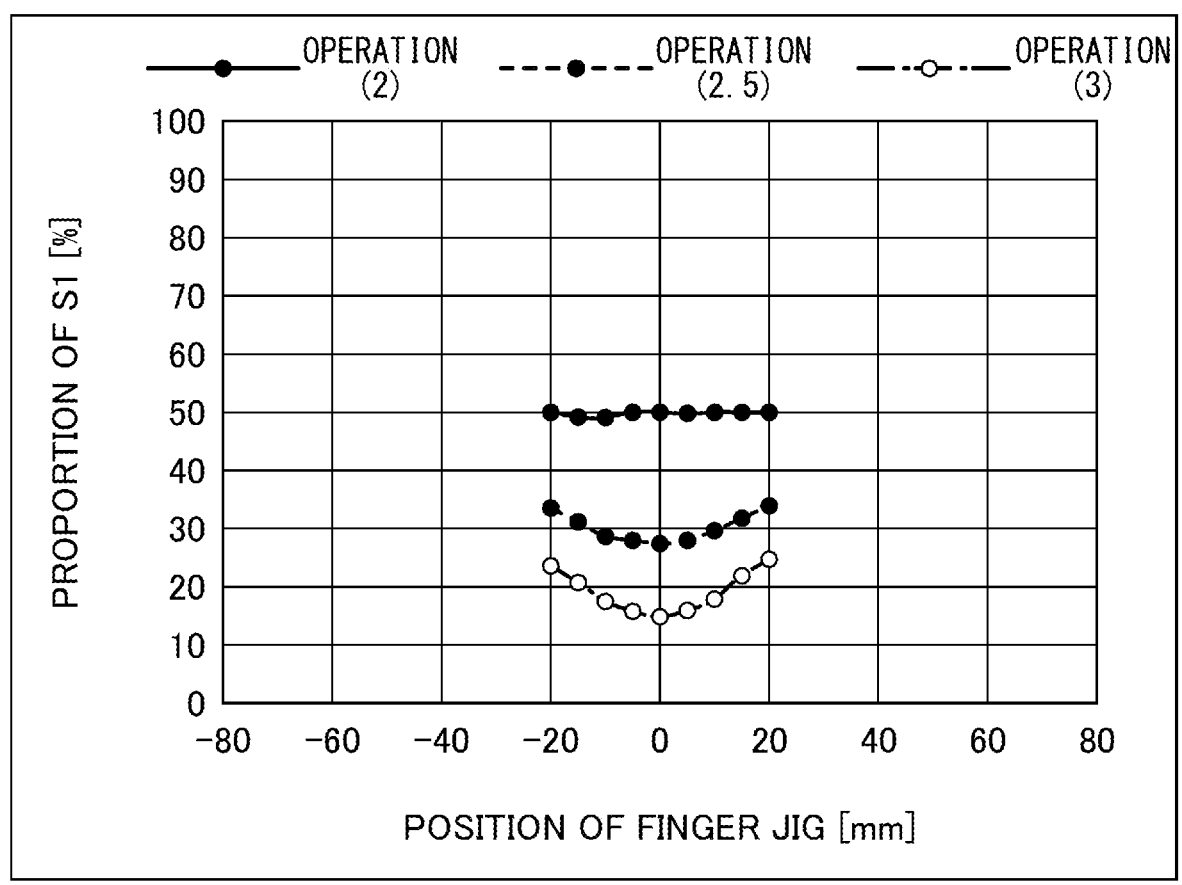
FIG. 10A is a diagram showing the proportion of self-capacitance S1 in an electrostatic sensor.
Figure 10B:
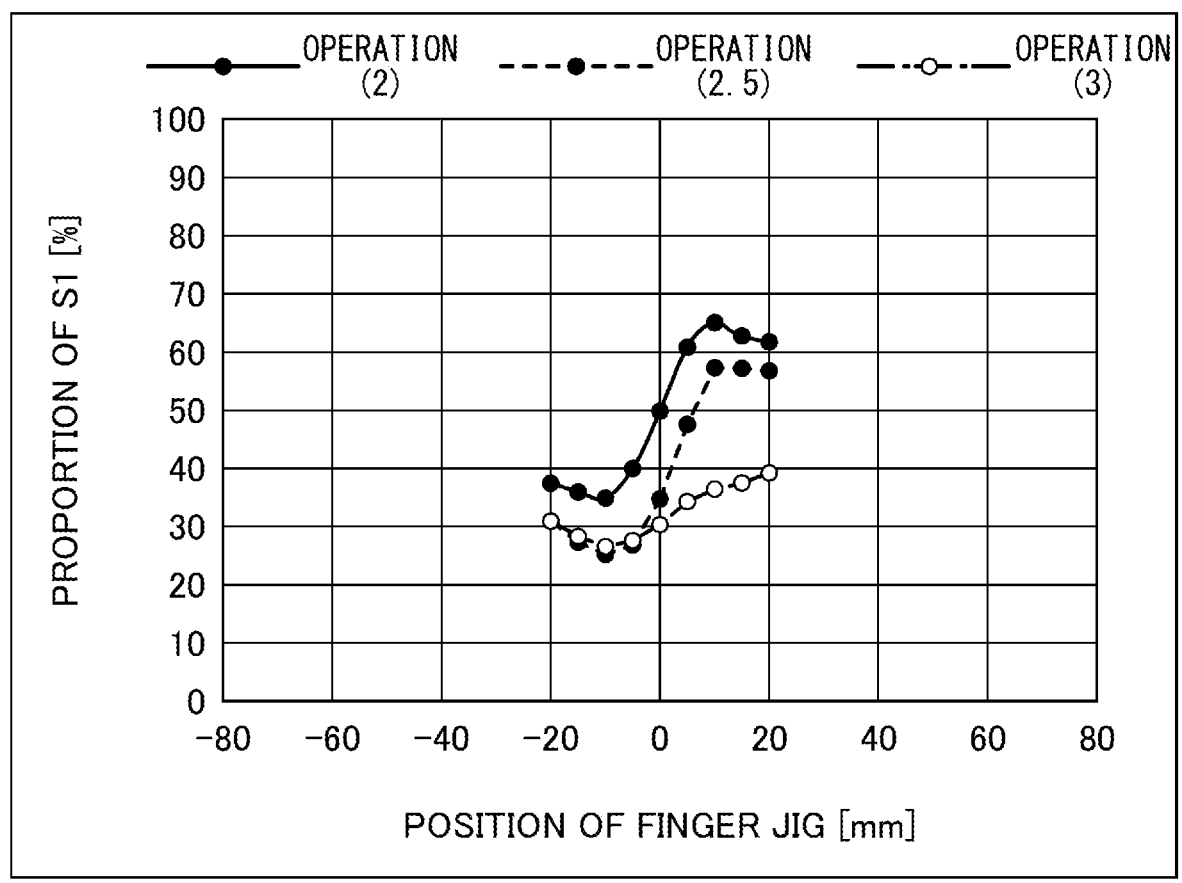
FIG. 10B is a diagram showing the proportion of self-capacitance S1 in an electrostatic sensor for comparison.

FIG. 10A is a diagram showing the proportion of self-capacitance S1 in the electrostatic sensor 110. FIG. 10B is a diagram showing the proportion of self-capacitance S1 in the electrostatic sensor 50 for comparison. FIG. 10A and FIG. 10B show the proportions of self-capacitance S1 when operations (2), (2.5), and (3) were performed. FIG. 10A shows the proportion of self-capacitance S1 in the electrostatic sensor 110, and FIG. 10B shows the proportion of self-capacitance S1 in the electrostatic sensor 50 for comparison.

As shown in FIG. 10A, when operations (2), (2.5), and (3) were performed, the proportion of self-capacitance S1 in the electrostatic sensor 110 showed slight variation when operations (2.5) and (3) were performed. However, the characteristics shown then are completely different from the characteristic of operation (1) shown in FIG. 6A, so that it was confirmed that operations (1) and operations (2), (2.5), and (3) could be distinguished.

Also, as shown in FIG. 10B, the proportion of self-capacitance S1 in the comparative electrostatic sensor 50 when operations (2), (2.5), and (3) were performed varied significantly, in all cases, in the range of −20 mm to +20 mm from the center in the Y direction. All characteristics are similar to the movement in operation (1) at the center in the Y direction, shown in FIG. 9A.

Figures 11, 12:
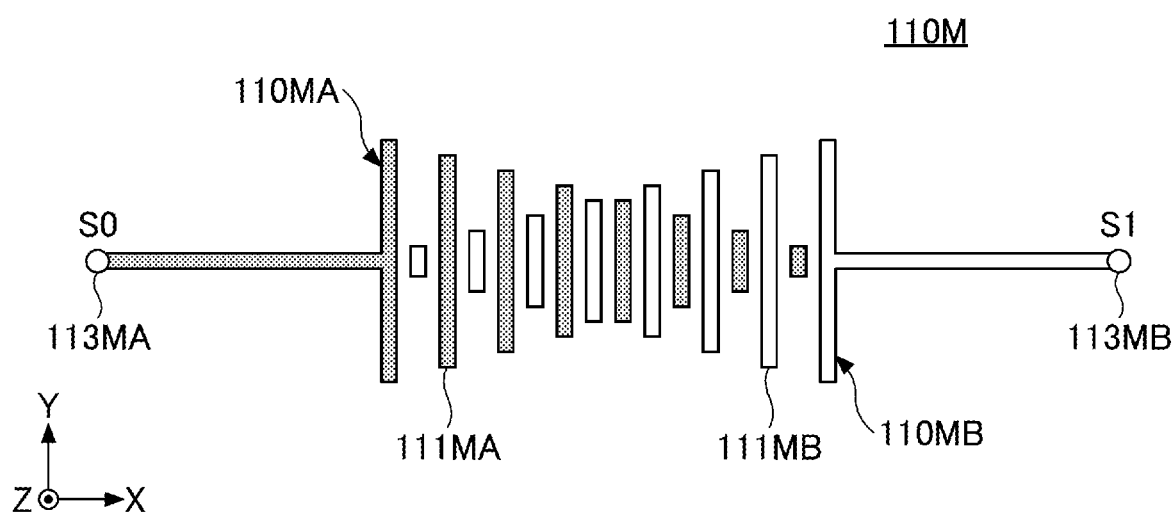
FIG. 11 is a diagram showing the difference between the maximum and minimum values of self-capacitance S1 between the electrostatic sensor and the electrostatic sensor for comparison.
FIG. 12 is a diagram showing an electrostatic sensor according to a modification of an embodiment.

FIG. 11 is a diagram showing the difference between the maximum value and the minimum value of the proportion of self-capacitance S1 between the electrostatic sensor 110 and the comparative electrostatic sensor 50. FIG. 11 shows the differences between the maximum values and minimum values of the proportion of self-capacitance S1 in operations (2), (2.5), and (3). The differences in the proportion of self-capacitance S1 during operations (2), (2.5), and (3) of the electrostatic sensor 110 were 1% (the difference between the minimum value of 49% and the maximum value of 50%), 6% (the difference between the minimum value of 28% and the maximum value of 34%), and 10% (the difference between the minimum value of 15% and the maximum value of 25%). The differences in the proportion of self-capacitance S1 during operations (2), (2.5), and (3) of the electrostatic sensor 50 for comparison were 30% (the difference between the minimum value of 35% and the maximum value of 65%), 32% (the difference between the minimum value of 26% and the maximum value of 58%), and 13% (the difference between the minimum value of 27% and the maximum value of 40%). As described above, the electrostatic sensor 110 showed smaller variation of the proportion S1/(S0+S1), corresponding to the positions upon movement in the Y direction, than the electrostatic sensor 50 for comparison.

This embodiment does not specify the XY coordinates, but determines the position on the first axis (X axis) from the output of two electrodes. Although all variation of proportion is determined in association with displacement on the first axis, with the electrostatic sensor 110, even if a hand or the like moves in the Y direction, the proportion does not change significantly. Therefore, it is possible to reduce the possibility of misidentifying movement in the Y-axis direction as movement in the first axial direction, or reduce the amount of movement that is misidentified.

Note that, by using an electrostatic sensor 110 having comb-like electrodes 110A and 110B, as shown in FIG. 6A and FIG. 10A, it is possible to distinguish between operations in the X direction (for example, operation (1)) and operations in the Y direction (for example, operations (2), (2.5), and (3)) based on the waveforms of self-capacitances S0 and S1. Therefore, it is possible to determine, from these waveforms, whether the movement in question is in the X direction or in the Y direction, and, for example, perform a predetermined action such as opening the door only when a swipe motion in the X axial direction is detected. In addition, it is also possible to lock/unlock the door when a swipe in the Y-axis direction is detected. Note that a swipe motion in the X-axis direction may be identified from the waveform, or may be identified by continuously specifying the positions in the X-axis direction as described above.

As described above, it is possible to provide an electrostatic input device 100 that can accurately specify the direction and amount of movement of an object targeted for detection. That is, it is possible to provide an electrostatic input device 100 that can accurately identify the position where an operation is performed. Also, although a case has been described above where a swipe operation is performed by contacting the door handle 10, it is equally possible to identify and detect movement in the X direction or in the Y direction even when the fingers do not touch the door handle 10 but are only brought close to the surface of the door handle 10.

Note that, although an example has been described in the above description where the electrostatic input device 100 is applied to the door handle 10, the electrostatic input device 100 can be applied to devices other than the door handle 10, and can be applied to various devices for detecting the position of a living body such as a finger in accordance with changes in electrostatic capacitance. Also, if the electrostatic sensor 110 is immersed in or opposed to a liquid with the X direction being the depth direction, the portion in the liquid and the portion in the air have different dielectric constants and different capacitances with the electrodes, so that the liquid level can be detected.

Also, although an example has been described in the above description where a plurality of electrode parts 111A of the electrode 110A are connected by a connecting part 112A, it is equally possible to connect between a plurality of electrode parts 111A of the electrode 110A by using an inner layer of the substrate 110C and vias.

FIG. 12 is a diagram showing an electrostatic sensor 110M according to a modification of embodiment 1. The electrostatic sensor 110M has an electrode 110MA and an electrode 110MB. The substrate is omitted here. The electrode 110MA is an example of the first electrode, and the electrode 110MB is an example of the second electrode. The electrode 110MA has a plurality of electrode parts 111MA, and a terminal 113MA is connected. The electrode parts 111MA are connected with each other through an inner layer of the substrate, vias, and so forth. The electrode parts 111MA each have a rectangular shape with two sides extending in the Y direction. The electrode 110MB has a plurality of electrode parts 111MB, and is connected with a terminal 113MB. The electrode parts 111MB are connected with each other through an inner layer of the substrate, vias, and so forth. The electrode parts 111B each have a rectangular shape with two sides extending in the Y direction.

The electrode parts 111MA and the electrode parts 111MB are arranged on the X axis alternately in the X direction, and all have the same width in the X direction. Among a plurality of electrode parts 111MA, the electrode part 111MA that is located furthest in the −X direction has the longest length in the Y direction, and the electrode part 111MA that is located further in the +X direction has the shortest length in the Y direction. Therefore, the areas of the electrode parts 111MA decrease in order from the −X direction side to the +X direction side. Also, among the electrode parts 111MB, the electrode part 111MB that is located furthest in the −X direction side has the shortest length in the Y direction, and the electrode part 111MB that is located furthest in the +X direction side has the longest length in the Y direction. Therefore, the areas of the electrode parts 111MB increase in order from the −X direction side to the +X direction side. Such an electrostatic sensor 110M may be used instead of the electrostatic sensor 110 shown in FIG. 3.

Embodiment 2

Figure 13:
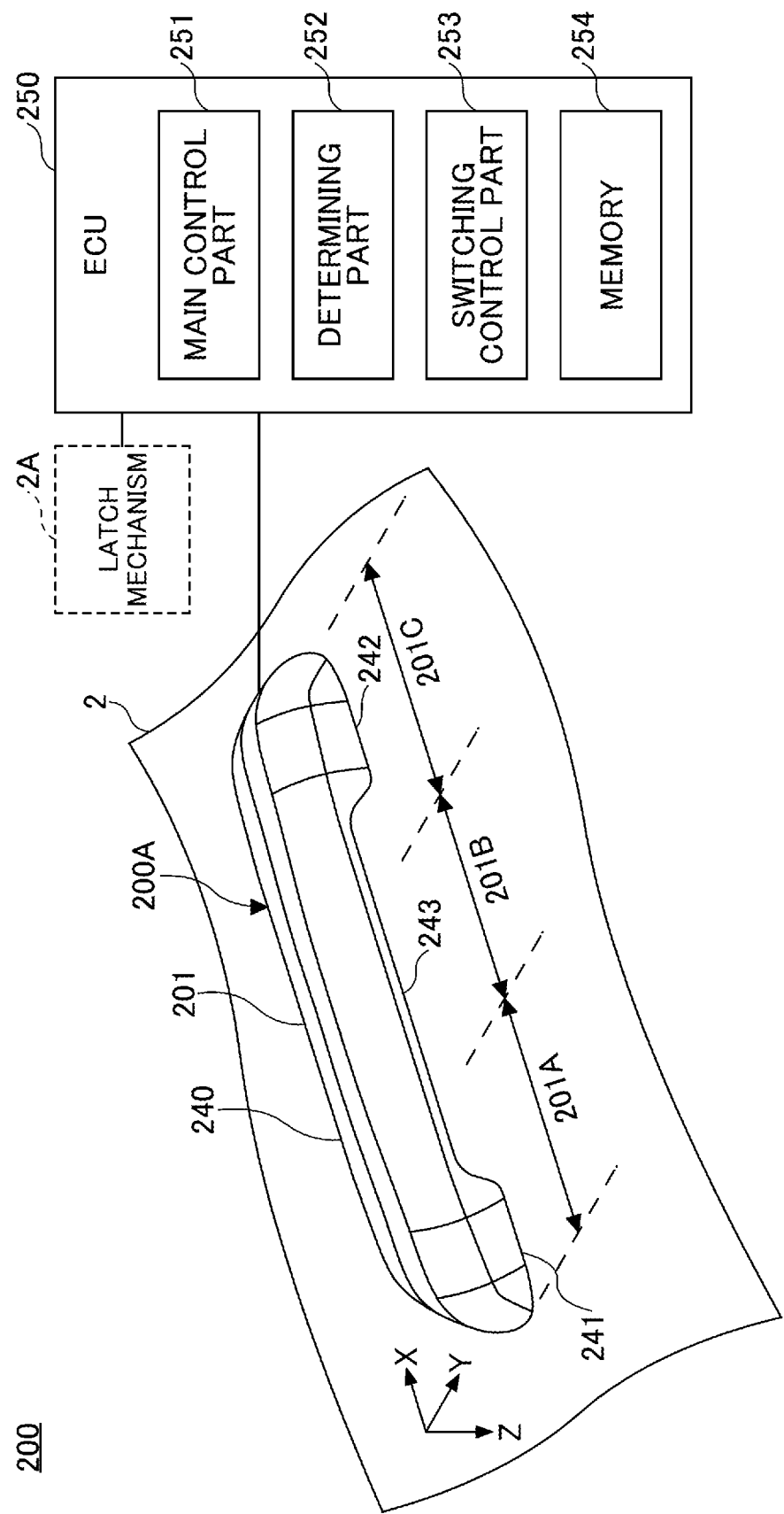
FIG. 13 is a diagram showing a door handle system according to an embodiment 2.
Figure 14:
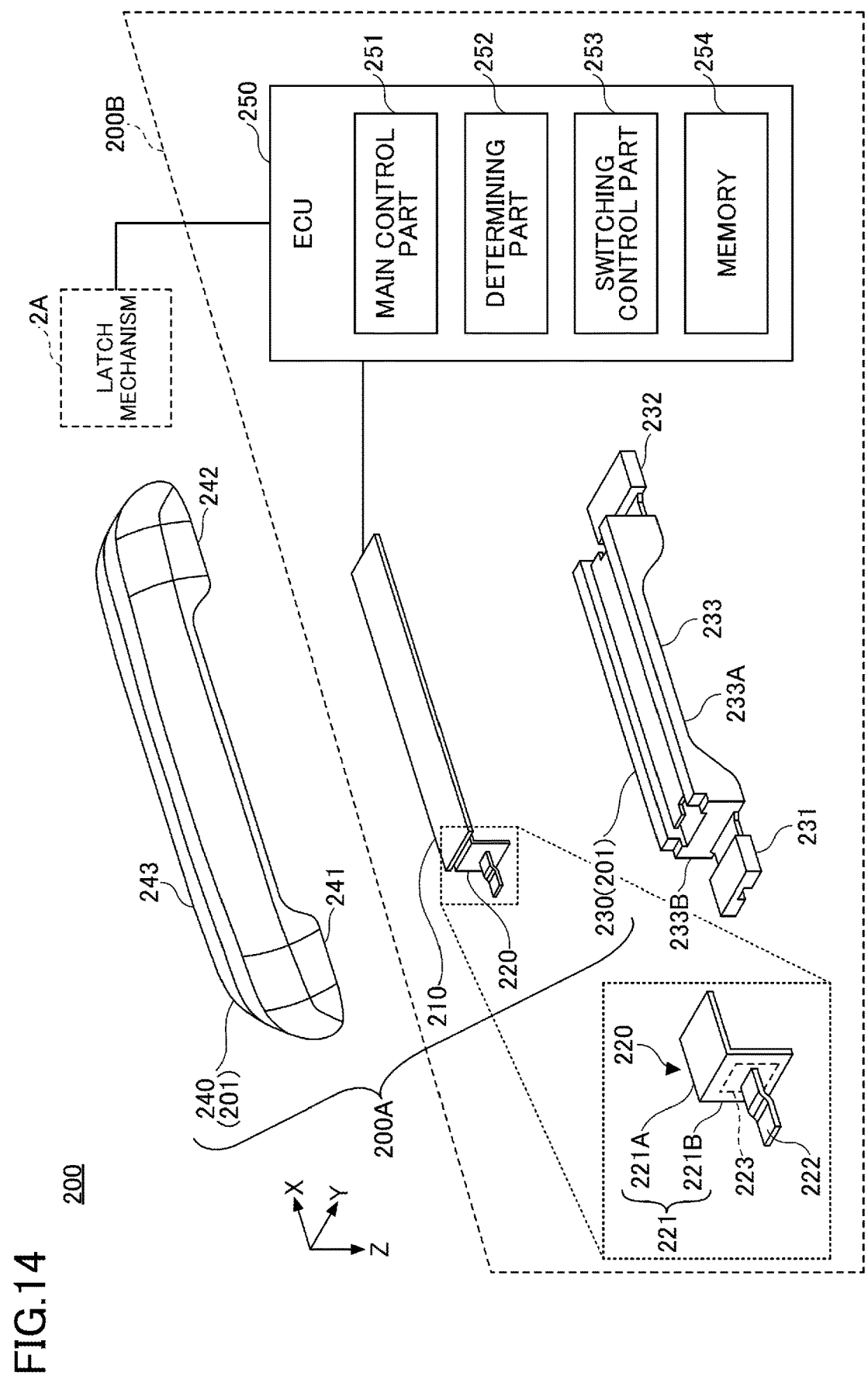
FIG. 14 is an exploded view of the door handle device of the door handle system.

FIG. 13 shows a door handle system 200 according to an embodiment 2. FIG. 14 is an exploded view of the door handle device 200A of the door handle system 200. The door handle system 200 includes a door handle device 200A, an ECU (Electronic Control Unit) 250, and a latch mechanism 2A. The door handle device 200A is attached to the door 2 of the vehicle 1 (see FIG. 1) in the same way as the door handle 10 of embodiment 1. Details of the door handle device 200A will be described later using FIG. 14.

The latch mechanism 2A is provided near the door handle device 200A. The latch mechanism 2A is a latch of the door 2 or the like, and is a mechanism whereby the door 2 can be kept closed with respect to the vehicle body of the vehicle 1. The state in which the door 2 is closed by the latch mechanism 2A is referred to as a "latched state," and the state in which the latched state is cancelled and the door 2 can be opened is referred to as an "unlatched state." When a door handle 201 of the door handle device 200A is pulled, the latch mechanism 2A is switched to the unlatched state by the door handle system 200. For example, when a switching command for switching from the latched state to the unlatched state is input from the ECU 250, the latch mechanism 2A drives the electric actuator of the latch mechanism 2A to switch to the unlatched state. Also, the latch mechanism 2A keeps the door 2 closed when the door 2 is closed. In this state, the latch mechanism 2A is in the latched state.

The door handle device 200A has an electrostatic sensor 210, a strain sensor 220, an inner case 230 and an outer case 240, as shown in FIG. 14. The strain sensor 220 is an example of a pressure sensor. The inner case 230 and the outer case 240 constitute the door handle 201 of the door handle device 200A. Therefore, in FIG. 14, the inner case 230 and the outer case 240 are shown with the code "201" in parentheses.

The electrostatic sensor 210, the strain sensor 220, the inner case 230, and the ECU 250 of the door handle system 200 constitute a door handle sensor system 200B. The door handle sensor system 200B is mounted in the vehicle 1 (see FIG. 1).

Here, first, the inner case 230 and the outer case 240 will be described. The door handle 201, composed of the inner case 230 and the outer case 240, is attached to the door 2 as shown in FIG. 13, and is a portion that the user holds and pulls with his/her hand when opening the door 2. The longitudinal direction of the door handle 201 extends in the X direction.

Here, for example, the door handle 201 itself has no movable parts, is fixed to the door 2, and therefore does not move. That is, the door handle 201 has no parts that move relative to the door 2 when pulled by the user's hand.

The outer case 240 is a portion of the door handle 201 provided outside the vehicle 1, and its longitudinal direction extends in the X direction. As shown in FIG. 14, the outer case 240 has a −X base part 241, a +X base part 242, and a bridge part 243. The bridge part 243 is located between the base parts 241 and 242, and is curved in the −Z direction (in the direction away from the surface of the door 2) from the base parts 241 and 242. The outer case 240 is fixed to the door 2 as the −X base part 241 and the +X base part 242 are attached to the door 2.

The inner case 230 is a portion of the door handle 201 provided inside the outer case 240. The longitudinal direction of the inner case 230 extends in the X direction, as shown in FIG. 14. The inner case 230 has a −X base part 231, a +X base part 232, and a bridge part 233. While the inner case 230 is in a state in which the base part 231, the base part 232, and the bridge part 233 are accommodated inside the base part 241, the base part 242, and the bridge part 243 of the outer case 240, respectively, the −X base part 231 and the +X base part 232 are attached to the door 2, so that the inner case 230 is fixed to the door 2 together with the outer case 240.

The bridge part 243 of the outer case 240 and the bridge part 233 of the inner case 230 are separate from the surface of the door 2, so that the user can put his/her hand between these bridge parts 243 and 233 and the surface of the door 2.

As shown in FIG. 14, the bridge part 233 of the inner case 230 has a groove part 233A, extending in the X direction at the widthwise center part in the Y direction, and an end surface 233B, substantially parallel to the YZ plane at the −X end part. The length in the X direction and the width in the Y direction of the groove part 233A are adjusted to match the length in the X direction and the width in the Y direction of the electrostatic sensor 210, so that the electrostatic sensor 210 can be accommodated virtually without gap. For example, the electrostatic sensor 210 is accommodated in the groove part 233A with the electrodes facing the +Z direction.

Between the bottom surface of the bridge part 233, which is parallel to the XY plane of the groove part 233A, and the −Z surface of the base part 231, there is a step to match the length of the end surface 233B in the Z direction. A strain sensor 220 is provided at this stepped portion. That is, the strain sensor 220 is provided on the −X direction side with respect to the door handle 201.

When the user tries to open the door 2 and holds and pulls the door handle 201 with his/her hand, the door handle system 200 and the door handle sensor system 200B are placed in a state in which the door 2 can be opened, as the strain sensor 220 detects the strain generated in the inner case 230 and/or the outer case 240 by the force applied to the inner case 230 and/or the outer case 240, and the ECU 250 drives the electric actuator of the latch mechanism 2A into the unlatched state.

The strain sensor 220 is provided across the base part 231 and the bridge part 233 of the inner case 230. The strain sensor 220 has a base part 221, a lever part 222, and a strain element 223, as shown enlarged in FIG. 14.

The base part 221 is L-shaped when viewed from the XZ plane, and has: a flat part 221A, which is substantially parallel to the XY plane, and which is fixed to the +Z surface of the −X end part of the electrostatic sensor 210; and a flat part 221B, which is substantially parallel to the YZ plane, and which is arranged on the surface of the end surface 233B of the bridge part 233 of the inner case 230.

The lever part 222 protrudes in the −X direction from the center of the −X surface of the flat part 221B of the base part 221. The lever part 222 is a rod-like member that is long and narrow, and provided integrally with the base part 221. The −X tip part of the lever part 222 is fixed to the −Z surface of the base part 231 of the inner case 230.

As an example, the strain element 223 is provided in the center part of the +X surface of the flat part 221B of the base part 221. For example, the strain element 223 and the lever part 222 are provided so as to overlap each other in YZ plane view.

Here, if the door handle 201 is pulled in the −Z direction while the door 2 is closed and the latch mechanism 2A is in the latched state, the bridge part 233 of the inner case 230 flexes (bends) with respect to the base parts 231 and 232 by the force (operating force) to pull the door handle 201 in the −Z direction.

To be more specific, a force (pressure) is applied to the base part 231 so that the end surface 233B of the bridge part 233 is deformed. By this means, a force to tilt the lever part 222 in the XZ plane is applied, and a force to bend the flat part 221B is applied to the flat part 221B. Since the flat part 221B is bent when such force acts thereupon, a strain sensor 220 can detect the force (pressure) applied to the bridge part 233. When a value greater than or equal to a predetermined threshold is detected on the strain sensor 220 is, it is detected that the door handle is pulled toward the user. The strain element described here is simply an example, and any example may be applicable here as long as the concept of detecting the operating force on the door handle 201 holds.

Since the strain sensor 220 is provided at the −X end part of the inner case 230, if the position of the door handle 201 where the user pulls the door handle 201 changes in the X direction, the strain sensor 220 detects different values even if the user's pulling force is the same. This is because, according to the principle of leverage, the position of the door handle 201 where the user pulls the door handle 201 changes with respect to the −X end part of the bridge part 233, which serves as the fulcrum and the action point.

Therefore, the door handle system 200 detects the position where the user touches the door handle 201, and changes the threshold for the ECU 250 for determining whether the door handle 201 is pulled, according to where in the X direction the position of the door handle 201 the user touches is located. This is to enable the user to cancel the latched state with the same operating force on the door handle 201, regardless of which position of the door handle 201 the user operates.

In order to enable such determination, the door handle 201 is divided into three sections in the X direction. These three sections are a first end section 201A, a center section 201B, and a second end section 201C. FIG. 13 shows the part where the first end section 201A, the center section 201B and the second end section 201C extend in the X direction.

The first end section 201A, the center section 201B, and the second end section 201C are three-dimensional sections including the door handle 201, and are defined in this order from the −X direction side to the +X direction side. That is, the first end section 201A is the section located furthest in the −X direction, the second end section 201C is the section located furthest in the +X direction, and the center section 201B is the section located between the first end section 201A and the second end section 201C.

In the X direction, the first end section 201A is the section to include the base part 241 of the outer case 240 and the −X end part of the bridge part 243. In the X direction, the second end section 201C is the section to include the base part 242 of the outer case 240 and the +X end part of the bridge part 243. In the X direction, the center section 201B is the section to include the center part of the bridge part 243 of the outer case 240, excluding the −X end part and the +X end part.

Figure 15:
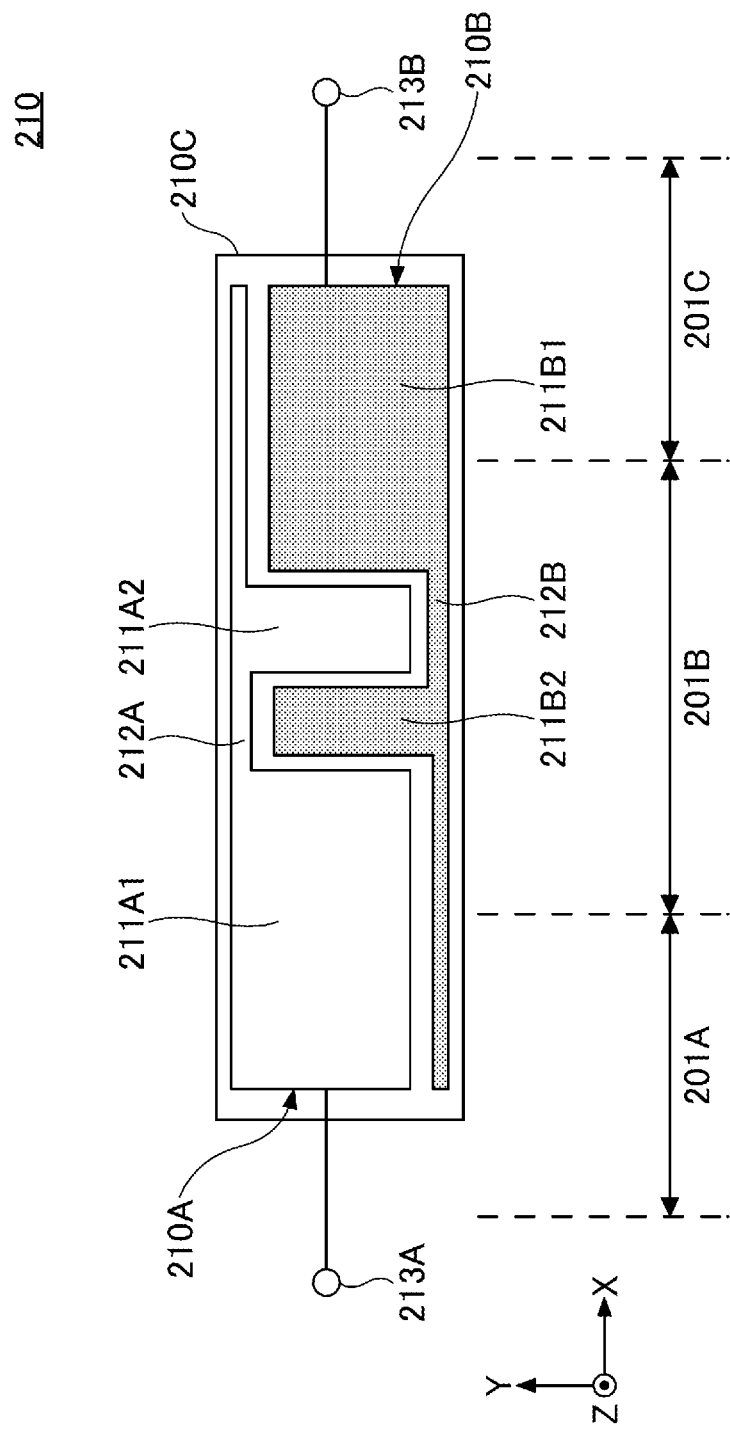
FIG. 15 is a diagram showing an electrostatic sensor according to embodiment 2.

Next, the electrostatic sensor 210 will be explained. The electrostatic sensor 210 will be described using FIG. 15, in addition to FIG. 13 and FIG. 14. FIG. 15 is a diagram showing the electrostatic sensor 210 according to embodiment 2. The electrostatic sensor 210 is provided to detect the user's approach or contact with the outer case 240 or the inner case 230.

The electrostatic sensor 210 has an electrode 210A, an electrode 210B and a substrate 210C. The electrode 210A is an example of the first electrode, and the electrode 210B is an example of the second electrode. Both electrodes 210A and 210B have a comb-like shape. The XYZ coordinate system is the same as in embodiment 1. The X direction is an example of the first direction, and the Y direction is an example of the second direction.

The electrode 210A has a plurality of electrode parts 211A1 and 211A2 and a connecting part 212A, and a terminal 213A is connected. There only have to be two or more electrode parts 211A1 and 211A2, for example, and FIG. 15 shows two electrode parts 211A1 and 211A2. Although the electrode parts 211A1 and 211A2 may be three or more in number, but are most preferably two in number.

The electrode parts 211A1 and 211A2 are examples of a plurality of first electrode parts, all having different widths in the X direction and equal lengths in the Y direction. The electrode parts 211A1 and 211A2 are arranged at intervals in the X direction. The electrode parts 211A1 and 211A2 each have a rectangular shape with two sides extending in the Y direction. Here, as an example, the electrode part 211A1 that is located further in the −X direction is wider in the X direction than the electrode part 211A2 located further in the +X direction. Therefore, the area of the electrode part 211A1 located further in the −X direction is larger than the area of the electrode part 211A2 located further in the +X direction. Note that one or a plurality of electrode parts that have the same size as the +X electrode part 211A2 shown in FIG. 15, or one or a plurality of electrode parts that have a different width in the X direction than the +X electrode part 211A2 may be additionally provided further in the +X direction than the +X electrode part 211A2. In this case, the pitches P in the X direction may be made equal between the +X electrode part 211A2 and the electrode part(s) added.

These multiple electrode parts 211A1 and 211A2 are arranged alternately (succeeding by turns) with a plurality of electrode parts 211B1 and 211B2 of the electrode 210B in the X direction, which is an example of the first direction, and arranged at overlapping positions in the Y direction. The interval in the X direction between adjacent electrode parts 211A1 and 211A2 and adjacent electrode parts 211B1 and 211B2 may be configured such that capacitive coupling occurs between at least one of the electrode part 211A1 or 211A2 and the electrode part 211B1 or 211B2 and fingers, regardless of where in the X direction the fingers are positioned. Such an interval is, for example, 0.5 mm or less, and 0.5 mm is a value obtained by a simulation.

The connecting part 212A is an example of the first connecting part, and is a linear pattern that connects between the +Y end parts of the electrode parts 211A1 and 211A2 in the X direction. The connecting part 212A extends in the X direction, even in the section where the +X electrode part 211B1 of the electrode 210B exists. The +Y direction side is an example of the first side. The width of the connecting part 212A in the Y direction is constant in the X direction. Because a plurality of electrode parts 211A1 and 211A2 are connected to the −Y direction side of the connecting part 212A extending in the X direction, the electrode 210A has a comb-like shape in plan view. Such an electrode 210A can be produced, for example, by patterning a metal foil such as a copper foil provided on the upper surface of the substrate 210C by etching or the like.

The electrode 210B has a plurality of electrode parts 211B1 and 211B2 and a connecting part 212B, and a terminal 213B is connected. There only have to be two or more electrode parts 211B1 and 211B2, for example, and FIG. 15 shows two electrode parts 211B1 and 211B2. Although the electrode parts 211B1 and 211B2 may be three or more in number, but are most preferably two in number.

The electrode parts 211B1 and 211B2 are examples of a plurality of first electrode parts, all having different widths in the X direction and equal lengths in the Y direction. The electrode parts 211B1 and 211B2 are arranged at intervals in the X direction. The electrode parts 211B1 and 211B2 each have a rectangular shape with two sides extending in the Y direction. Here, as an example, the electrode part 211B1 that is located further in the +X direction is wider in the X direction than the electrode part 211B2 located further in the −X direction. Therefore, the area of the electrode part 211B1 located further in the +X direction is larger than the area of the electrode part 211B2 located further in the −X direction. Note that one or a plurality of electrode parts that have the same size as the −X electrode part 211B2 shown in FIG. 15, or one or a plurality of electrode parts that have a different width in the X direction than the −X electrode part 211B2 may be additionally provided further in the −X direction than the −X electrode part 211B2. In this case, the pitches P in the X direction may be made equal between the −X electrode part 211B2 and the electrode part(s) added.

These electrode parts 211B1 and 211B2 are arranged alternately (succeeding by turns) with a plurality of electrode parts 211A1 and 211A2 of the electrode 210A in the X direction, which is an example of the first direction, and arranged at overlapping positions in the Y direction. The interval in the X direction between adjacent electrode parts 211A1 and 211A2 and adjacent electrode parts 211B1 and 211B2 may be configured such that capacitive coupling occurs between at least one of the electrode part 211A1 or 211A2 and the electrode part 211B1 or 211B2 and fingers, regardless of where in the X direction the fingers are positioned. Such an interval is, for example, 0.5 mm or less, and 0.5 mm is a value obtained by a simulation.

The connecting part 212B is an example of a second connecting part, and is a linear pattern that connects between the −Y end parts of the electrode parts 211B1 and 211B2 in the X direction. The connecting part 212B extends in the X direction, even in the section where the −X electrode part 211A1 of the electrode 210A exists. The −Y direction side is an example of the second side. The width of the connecting part 212B in the Y direction is constant in the X direction. Because a plurality of electrode parts 211B1 and 211B2 are connected to the +Y direction side of the connecting part 212B extending in the X direction, the electrode 210B has a comb-like shape in plan view. Such an electrode 210B can be produced, for example, by patterning a metal foil such as a copper foil provided on the upper surface of the substrate 210C by etching or the like.

Note that, although an example will be described here in which a plurality of electrode parts 211A1, 211A2, 211B1 and 211B2 extend in a direction orthogonal to the connecting parts 212A and 212B in plan view, the electrode parts 211A1, 211A2, 211B1, and 211B2 may extend in directions not at right angles with the connecting parts 212A and 212B in plan view (for example, at an angle less than 90 degrees, an angle greater than 90 degrees, etc.), and may even have a curved shape in plan view.

The substrate 210C is, for example, a wiring substrate conforming to FR4 standard. The electrodes 210A and 210B are formed on the top surface of the substrate 210C as an example. Note that the substrate 210C may be a flexible substrate, and the electrodes 210A and 210B may be formed on the top and bottom surfaces of the substrate 210C, respectively. Also, the electrodes 210A and 210B may be formed on two substrates, separately, and the two substrates may be stacked by insulting the electrodes 210A and 210B from each other.

The relationships between this electrostatic sensor 210 and the first end section 201A, the center section 201B and the second end section 201C are shown in FIG. 15. The first end section 201A is a section in which the electrostatic sensor 210 can detect operating positions on the −X direction side in the X direction. Therefore, the −X end part of the first end section 201A is located further in the −X direction than the −X end parts of the electrodes 210A and 210B, and the boundary between the first end section 201A and the center section 201B is located halfway in the X direction of the −X electrode part 211A1 of the electrode 210A. That is, the first end section 201A includes at least the −X end part of the −X electrode part 211A1.

Similarly, the second end section 201C is a section in which the electrostatic sensor 210 can detect operating positions on the +X direction side in the X direction. Therefore, the +X end part of the second end section 201C is located further in the +X direction than the +X end parts of the electrodes 210A and 210B, and the boundary between the center section 201B and the second end section 201C is located halfway in the X direction of the +X electrode part 211B1 of the electrode 210B. The second end section 201C includes at least the +X end part of the +X electrode part 211B1.

The center section 201B is a section in which the electrostatic sensor 210 can detect as a middle portion in the X direction, and is located between the first end section 201A and the second end section 201C in the X direction. The center section 201B includes a +X electrode part 211A2 of the electrode 210A and a −X electrode part 211B2 of the electrode 210B. Of the two electrode parts 211A1 and 211A2 included in the electrode 210A, the +X electrode part 211A2 of the electrode 210A is the electrode part other than the electrode part 211A1 of the first end section 201A side (first end section side). Of the two electrode parts 211B1 and 211B2 included in the electrode 210B, the −X electrode part 211B2 of the electrode 210B is the electrode part other than the electrode part 211B1 of the first end section 201C side (second end section side). Note that the ranges of the first end section 201A, the center section 201B and the second end section 201C in the X-direction may vary depending on the length of the electrostatic sensor 210 in the X-direction, the widths and positions of the electrode parts 211A1 and 211A and the electrode parts 211B1 and 211B2 in the X direction, and so forth.

The ECU 250 is an example of a control device, and implemented by a computer that includes a CPU (Central Processing Unit), a RAM (Random Access Memory), a ROM (Read Only Memory), an input/output interface, an internal bus, and the like. The ECU 250 may be connected with an ECU that controls various electronic devices of the vehicle 1 via an intra-vehicle network such as CAN (Controlled Area Network) or ETHERNET (registered trademark).

The ECU 250 has a main control part 251, a determining part 252, a switching control part 253 and a memory 254. The main control part 251, the determining part 252, and the switching control part 253 represent the functions of programs that are executed on the ECU 250 as functional blocks. Also, the memory 254 functionally represents the memory of the ECU 250.

The main control part 251 is a processing part that supervises the control of the ECU 250, and executes processes other than the processes executed by the determining part 252 and the switching control part 253.

The determining part 252 determines whether the position of the door handle 201 the user operates is in the first end section 201A, the center section 201B, or the second end section 201C of the door handle 201 (the outer case 240 and the inner case 230), based on the ratio of self-capacitance between the electrodes 210A and 210B of the electrostatic sensor 210. The ratio of self-capacitance between the electrodes 210A and 210B is the ratio of the self-capacitance of one of the electrodes 210A and 210B, to the self-capacitance of the other. The electrostatic sensor 210 is a self-capacitive type, and self-capacitance refers to the capacitance obtained with a self-capacitive electrostatic sensor.

The switching control part 253 is a switching control part that switches the door 2 from the latched state to the unlatched state when the value detected on the strain sensor 220 is greater than or equal to a threshold. Also, the switching control part 253 switches the threshold in accordance with the result of determination by the determining part 252. To be more specific, the switching control part 253 sets the threshold to a larger value when the determining part 252 determines that the position of an operation by the user is in the center section 201B than when the determining part 252 determines that the position of an operation by the user is in the first end section 201A. Also, the switching control part 253 sets the threshold to a larger value when the determining part 252 determines that the position of an operation by the user is in the second-end section 201C than when the determining part 252 determines that the position of an operation by the user is in the center section 201B. This takes into account the principle of leverage, as explained earlier.

The memory 254 stores the programs and data that the ECU 250 uses to execute the above processes, and at least temporarily stores the data generated in the course of processes, such as self-capacitance.

Now, even if the actual position of the user's hand in the X direction with respect to the door handle 201 is the same, the self-capacitance detected by the electrostatic sensor 210 changes when the distance from the surface of the door handle 201 to the user's hand changes. Therefore, even if the actual position of the user's hand in the X direction with respect to the door handle 201 is the same, when the distance from the surface of the door handle 201 to the user's hand changes, there is a risk that the position of the user's hand is misidentified as having changed its location in the X direction.

For example, when the user touches the door handle 201 with a bare hand and when the user touches the door handle 201 with a gloved hand, the distance from the electrostatic sensor 210 to the hand differs, and therefore the detection result of the position of the user's hand in the X direction might also change. Note that the reason the self-capacitance detected by the electrostatic sensor 210 changes when the distance from the surface of the door handle 201 to the user's hand changes will be described later using FIG. 16.

Such variation of detection results in the X direction becomes more noticeable as the self-capacitances (parasitic capacitances) of the electrodes 210A and 210B of the electrostatic sensor 210 increase. This is because the voltage between the electrodes 210A and 210B is inversely proportional to the self-capacitances of the electrodes 210A and 210B.

Therefore, the self-capacitance between the electrodes 210A and 210B should be reduced in order to reduce the variation of detection results in the X direction. The electrodes 210A and 210B are arranged like a nested comb in plan view, so that, by shortening the length of sections in which the electrodes 210A and 210B are placed so as to neighbor each other, the self-capacitances of the electrodes 210A and 210B can be reduced.

From this point of view, the electrodes 210A and 210B each have two electrode parts 211A1 and 211A2 and two electrode parts 211B1 and 211B2, That is, as shown in FIG. 15, a reduced number of electrode parts, namely the electrode parts 211A1, 211A2, 211B1, and 211B2, are arranged in a nested manner.

Figure 16:
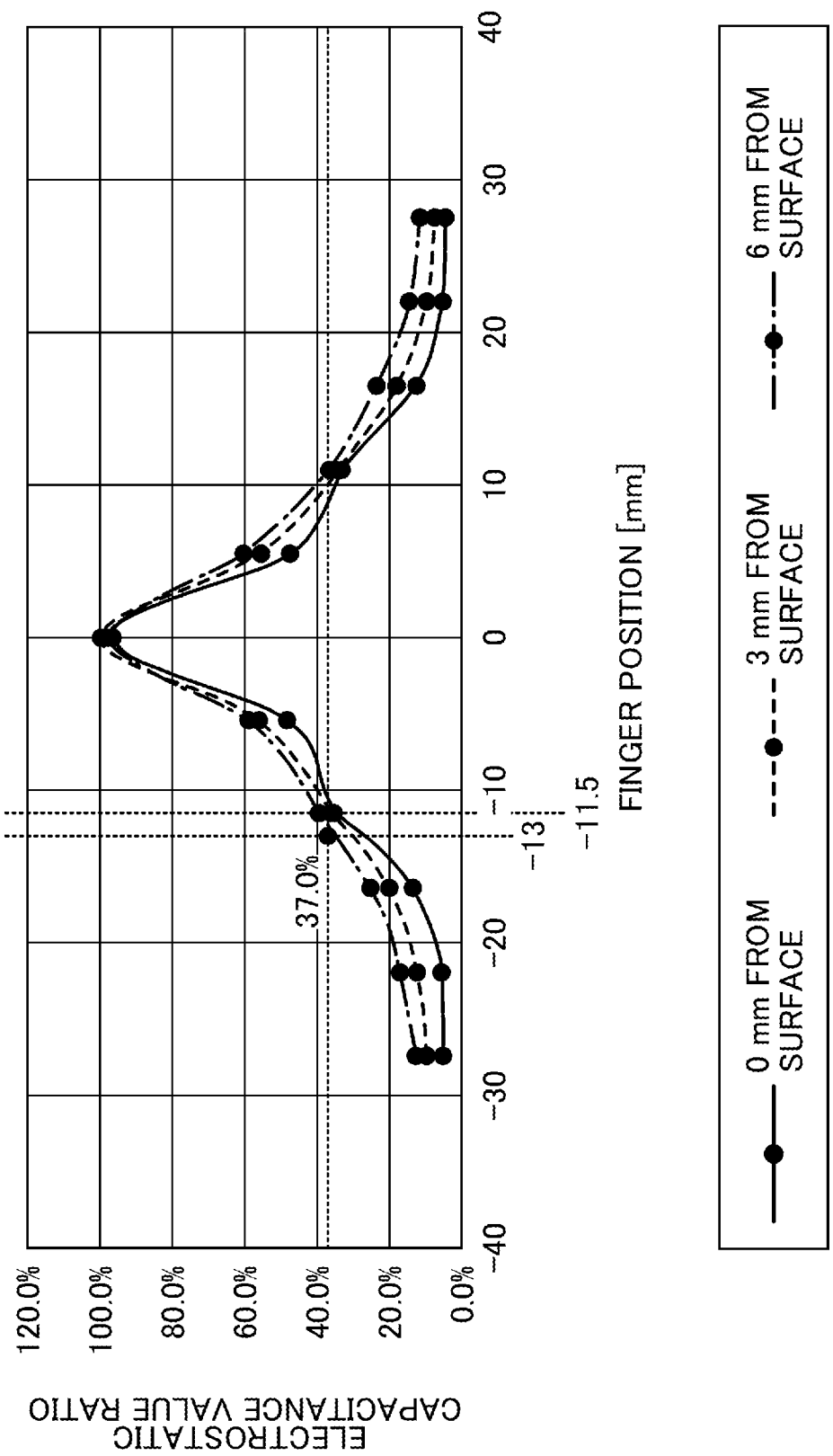
FIG. 16 is a diagram showing the characteristics of the ratio of the self-capacitances of two electrodes versus the position of fingers in the X direction on the door handle.

FIG. 16 is a diagram to show the characteristics of the ratio of the self-capacitances of electrodes 210A and 210B versus the positions of fingers on the door handle 201 in the X direction. The characteristics shown in FIG. 16 were determined by an electromagnetic field simulation. Here, a case will be considered in which the user touches the door handle 201 with two fingers that neighbor each other in the X direction. Two rod-like dielectrics simulating two human fingers are used, and the dielectrics are 11 mm thick. Hereinafter, the position of fingers in the X direction (finger position) is the X coordinate of a position between two fingers that neighbor each other in the X direction.

As for the finger position on the door handle 201 in the X direction, the position of the center of the electrostatic sensor 210 in the X direction is 0 mm, the −X direction side is represented by negative values, and the +X direction side is represented by positive values.

Also, the ratio of self-capacitance in FIG. 16 is different from the ratio of self-capacitance that the determining part 252 uses to determine whether the position of an operation is in the first end section 201A, the center section 201B, or the second end section 201C (the ratio of the self-capacitance of one of the electrodes 210A and 210B to the self-capacitance of the other one). The ratio of self-capacitance in FIG. 16 is the value obtained by dividing the smaller self-capacitance by the larger self-capacitance of the two self-capacitances of the electrodes 210A and 210B (smaller self-capacitance/larger self-capacitance). The ratio of self-capacitance becomes 100% when the position of an operation is at the center position (0 mm) of the electrostatic sensor 210 in the X direction. Since the self-capacitances of these two electrodes 210A and 210B are equal at this time, the same value is obtained regardless of which value is the numerator or the denominator. Note that, as examples of the self-capacitances of the electrodes 210A and 210B, values obtained by digitally converting the values (analog values) detected by the mutual capacitance method were used.

Also, the characteristic of the ratio of self-capacitance were determined for cases in which the fingers were positioned at three different positions in the Z direction, namely the positions 0 mm, 3 mm, and 6 mm away from the surface of the door handle 201 in the −Z direction. The solid line indicates the characteristic in the case of 0 mm, the dashed line indicates the characteristic in the case of 3 mm, and the one-dot chain line indicates the characteristic in the case of 6 mm.

As shown in FIG. 16, the ratio of self-capacitance varied depending on the height from the surface of the door handle 201, and the overall tendency was that the ratio of self-capacitance was the smallest at the position of 0 mm from the surface, and the ratio of self-capacitance was the largest at the position of 6 mm from the surface. The reason the ratio of self-capacitance varied depending on the height of fingers from the surface of the door handle 201 is that, for the self-capacitance between the electrode 210A and fingers, the ratio of the distance between the +X electrode parts 211A1 and 211A2 and fingers, and the distance between the −X electrode parts 211A1 and 211A2 and fingers, changes depending on the height of fingers from the surface of the door handle 201. Also, as for the self-capacitance between the electrode 210B and fingers, the ratio of the distance between the +X electrode part 211B1 and fingers, and the distance between the −X electrode part 211B2 and fingers, changes depending on the height of fingers from the surface of the door handle 201.

For example, when the position of fingers in the X direction was X=−11.5 mm, the ratio of self-capacitance at 0 mm from the surface was 37%. Also, the ratio of self-capacitance at 6 mm from the surface was 37% when the position of fingers in the X direction was X=−13 mm, and the difference between these two positions was 1.5 mm. That is, it was made clear that an error of approximately 1.5 mm may be produced in detection of finger positions in the X direction depending on whether the door handle 201 is operated with a bare hand or with a hand wearing a 6 mm-thick glove.

Figure 17:
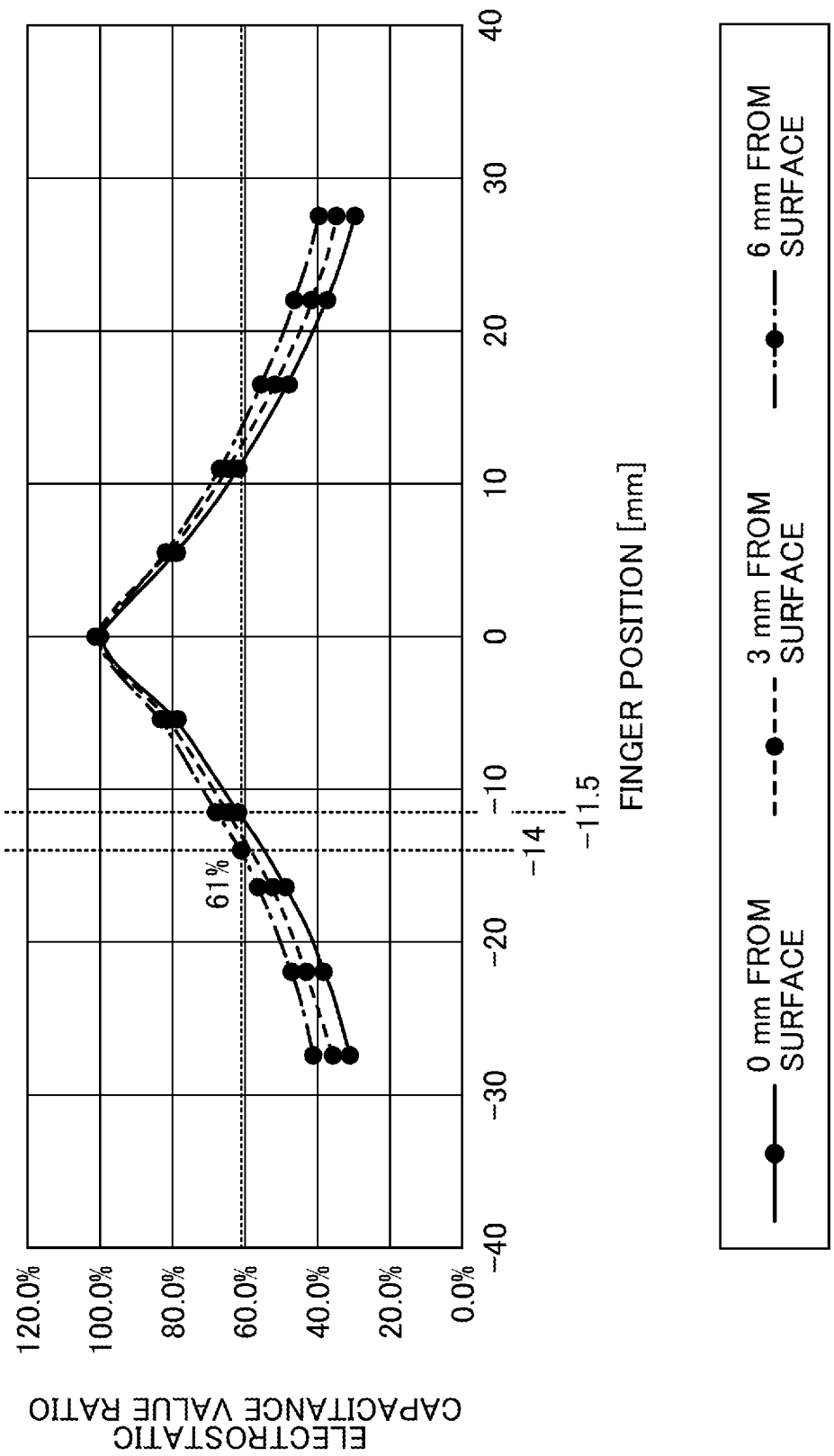
FIG. 17 is a diagram showing the characteristics of the ratio of the self-capacitances of two comb-like electrodes versus the position of fingers in the X direction in a door handle including an electrostatic sensor according to a modification.

FIG. 17 is a diagram showing the characteristics of the ratio of the self-capacitances of two comb-like electrodes versus the position of fingers in the X direction in a door handle containing an electrostatic sensor according to a modification of embodiment 1. The two comb-like electrodes of the electrostatic sensor of the modification include 19 electrode parts each, similar to the simulation model of FIG. 4 of embodiment 1. Since each of the two comb-like electrodes include 19 electrode parts, the length of sections in which the two comb-like electrodes are arranged close to each other is significantly longer than the electrodes 210A and 210B of the electrostatic sensor 210 of embodiment 2, and the self-capacitances (parasitic capacitances) of the two comb-like electrodes are significantly increased. Also, similar to the ratio of self-capacitance in FIG. 16, the ratio of self-capacitance in FIG. 17 is the value obtained by dividing the smaller self-capacitance by the larger self-capacitance of the two self-capacitances of the two comb-like electrodes (smaller self-capacitance/larger self-capacitance).

The characteristics shown in FIG. 17 were determined by an electromagnetic field simulation in the same way as the characteristics shown in FIG. 16. The positions of fingers on the door handle in the X direction and the Z direction are the same as in the characteristics shown in FIG. 16, and the solid line indicates the characteristic in the case of 0 mm, the dashed line indicates the characteristic in the case of 3 mm, and the one-dot chain line indicates the characteristic in the case of 6 mm.

As shown in FIG. 17, the differences in the ratio of self-capacitance depending on the height from the surface of the door handle were larger than in the characteristics shown in FIG. 16, and, on the whole, showed high values. Similar to the characteristics shown in FIG. 16, the overall tendency was that the ratio of self-capacitance was the smallest at the position of 0 mm from the surface, and the ratio of self-capacitance was the largest at the position of 6 mm from the surface.

For example, when the position of fingers in the X direction was X=−11.5 mm, the ratio of self-capacitance at 0 mm from the surface was 61%. Also, the ratio of self-capacitance at 6 mm from the surface was 61% when the position of fingers in the X direction was X=−14 mm. The difference between these two positions was 2.5 mm. That is, it was made clear that an error of approximately 2.5 mm may be produced in detection of finger positions in the X direction depending on whether the door handle equipped with the electrostatic sensor for comparison is operated with a bare hand or with a hand wearing a 6 mm-thick glove.

This means that the detection error in the X direction increases by approximately 67% compared to when operating the door handle 201 containing the electrostatic sensor 210 of embodiment 2. In other words, this means that the door handle system 200 and the door handle sensor system 200B of embodiment 2 can reduce the detection error in the X direction by 40% compared to the door handle system containing the electrostatic sensor for comparison.

Note that the modified electrostatic sensor used in the simulation of FIG. 17 and the electrostatic sensor 210 used in the simulation of FIG. 16 were actually made, and two rod-like dielectric bodies simulating two human fingers were arranged in the first end section 201A, the center section 201B, and the second end section 201C. In this arrangement, the self-capacitances were measured, and the following results were obtained. The self-capacitances shown here are count values obtained by digitally converting the self-capacitances (analog values) obtained from the electrostatic sensor according to the modification and the electrostatic sensor 210. The electrostatic sensor of the modification and the electrostatic sensor 210 are both self-capacitive, and no unit of measurement applies when self-capacitance is expressed as a count value.

While the self-capacitance obtained in the first end section of the electrostatic sensor of the modification was 213, the self-capacitance obtained in the first end section 201A of the electrostatic sensor 210 was 263. The self-capacitance obtained in the center section 201B of the electrostatic sensor 210 was 311, while the self-capacitance obtained in the center section of the electrostatic sensor of the modification was 235. The self-capacitance obtained in the second end section of the electrostatic sensor of the modification was 212, while the self-capacitance obtained in the second end section 201C of the electrostatic sensor 210 was 263. It was found out that the self-capacitances at the first end section 201A and the second end section 201C increased by approximately 23%, and the self-capacitance at the center section 201B increased by approximately 32%. This is likely to be because, given that the electrodes 210A and 210B of the electrostatic sensor 210 have smaller self-capacitances (parasitic capacitances) than the electrostatic sensor for comparison, the detection values increased when the two rod-like dielectric bodies simulating two human fingers were provided.

Figure 18:
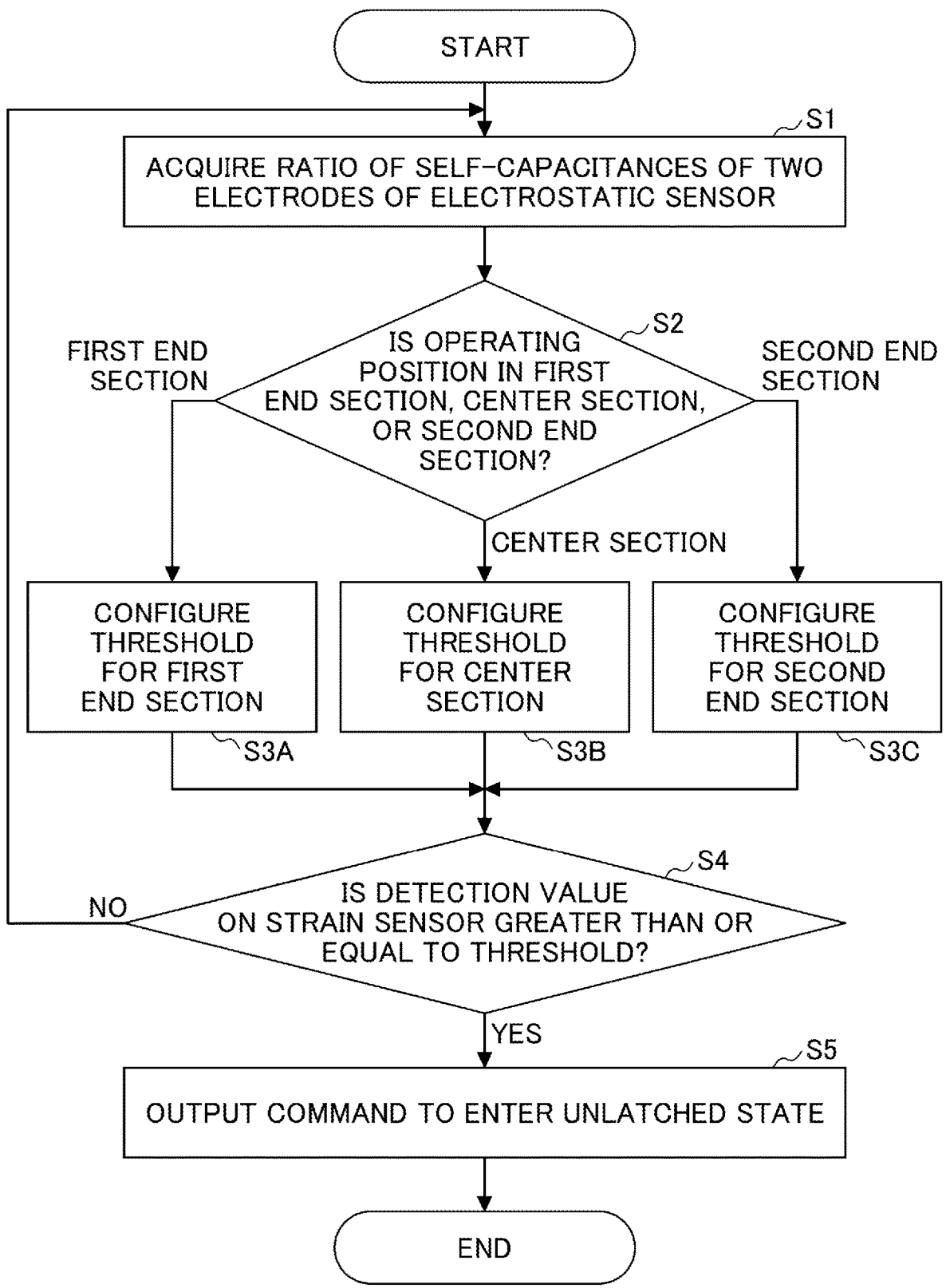
FIG. 18 is a diagram showing a flowchart representing the processes executed by an ECU.

FIG. 18 is a diagram showing a flowchart representing the process executed by the ECU 250. The ECU 250 executes the process shown in FIG. 18 while power is supplied from a power supply such as the battery of the vehicle 1.

The determining part 252 obtains the ratio of the self-capacitances of the two electrodes 210A and 210B of the electrostatic sensor 210 (step S1).

The determining part 252 determines whether the position of an operation is in the first end section 201A, the center section 201B, or the second end section 201C (step S2).

When the determining part 252 determines in step S2 that the position of an operation is in the first end section 201A, the switching control part 253 reads the threshold for the first end section 201A from the memory 254 and configures this as the threshold (step S3A).

Also, when the determining part 252 determines in step S2 that the position of an operation is in the center section 201B, the switching control part 253 reads the threshold for the center section 201B from the memory 254 and configures this as the threshold (step S3B).

When the determining part 252 determines in step S2 that the position of an operation is in the second end section 201C, the switching control part 253 reads the threshold for the second end section 201C from the memory 254 and configures this as the threshold (step S3C).

When the process of step S3A, S3B, or S3C is finished, the switching control part 253 determines whether or not the value detected on the strain sensor 220 is greater than or equal to the configured threshold (step S4).

When the switching control part 253 determines that the detected value on the strain sensor 220 is greater than or equal to the threshold (S4: YES), the switching control part 253 outputs a command to switch the latch mechanism 2A to the unlatched state, to the latch mechanism 2A (step S5). When the process of step S5 is finished, one control cycle of processes is finished, and the flow returns to the start. The ECU 150 repeats executing the above processes.

As described above, in the door handle system 200 and the door handle sensor system 200B of embodiment 2, the electrodes 210A and 210B of the electrostatic sensor 210 have two electrode parts 211A1 and 211A2 and two electrode parts 211B1 and 211B2, respectively. By thus reducing the self-capacitances (parasitic capacitances) of the electrodes 210A and 210B of the electrostatic sensor 210, the error in detecting the position of fingers in the X direction due to the variation of the height of fingers relative to the surface of the door handle 201 can be reduced. Therefore, it is possible to improve the accuracy of determining in which of the first end section 201A, the center section 201B, and the second end section 201C of the door handle 201 an operation is taking place.

Therefore, it is possible to provide a door handle sensor system 200B that can accurately identify the position where an operation is performed.

Also, where there are a plurality of electrode parts 211A1 and 211A2 provided, in the electrode part 211A1 located at the end of the X direction on the first end section 201A side, at least the end part facing the side (−X direction side) where the first end section 201A is located in the X direction is placed in the first end section 201A. Also, where there are a plurality of electrode parts 211B1 and 211B2 provided, in the electrode part 211B1 located at the end of the X direction on the second end section 201C side, at least the end part facing the side (+X direction side) where the second end section 201C is located in the X direction is placed in the second end section 201C. Therefore, the plurality of electrode parts 211A1 and 211A2 and the plurality of electrode parts 211B1 and 211B2 that are arranged alternately in the X direction can be appropriately allocated to the first end section 201A, the center section 201B, and the second end section 201C, so that the unlatched state can be controlled appropriately based on determination results in the determining part 252 and detection values on the strain sensor 220.

Also, given that the plurality of electrode parts 211A1 and 211A2 are two electrode parts and the plurality of electrode parts 211B1 and 211B2 are two electrode parts 211B1 and 211B2, it is possible to reduce the self-capacitances (parasitic capacitances) of the electrodes 210A and 210B and reduce the errors in detecting the position of fingers in the X direction due to the variation of the height of fingers relative to the surface of the door handle 201. As a result of this, it is possible to improve the accuracy of determining which of the first end section 201A, the center section 201B, and the second end section 201C of the door handle 201 is operated.

Also, the area of the electrode part 211A2 arranged in the center section 201B between the two electrode parts 211A1 and 211A2, and the area of the electrode part 211B2 arranged in the center section 201B between the two electrode parts 211B1 and 211B2 are equal, so that the self-capacitances of the electrodes 210A and 210B can be balanced when an operation is performed in the center section 201B. Therefore, the ratio of self-capacitance when an operation is performed in the center section 201B can be set to a value close to 1:1, thereby making it easier to build a determination logic for determining in which of the first end section 201A, the center section 201B, and the second end section 201C the user's hand is performing an operation.

Also, the ECU 250 has a switching control part 253 that switches the door 2 from the latched state to the unlatched state when a value greater than or equal to a threshold is detected on the strain sensor 220, the switching control part 253 changes the threshold in accordance with the result of determination by the determining part 252. Therefore, even if the strain sensor 220 is located at an end part of the door handle 201 in the X direction and the detection value on the strain sensor 220 varies depending on the position in the X direction where the door handle 201 is operated, it is still possible to determine whether or not an operation is performed, depending on the position of the operation.

Also, the strain sensor 220 is provided on the side of the X direction where the electrode part 211A1 at the end of the first end section 201A side (the first end section side) is located. The switching control part 253 configures a larger threshold when the determining part 252 determines that the position of an operation by the user is in the central region 201B than when the determining part 252 determines that the position of an operation by the user is in the first end section 201A, and configures a larger threshold when the determining part 252 determines that the position of an operation by the user is in the second end region 201C than when the determining part 252 determines that the position of an operation by the user is in the center region 201B. Therefore, the position of an operation can be determined accurately in accordance with the variation of values detected on the strain sensor 220, caused by the variation of the position of an operation in the X direction in accordance with the principle of leverage.

Figure 19:
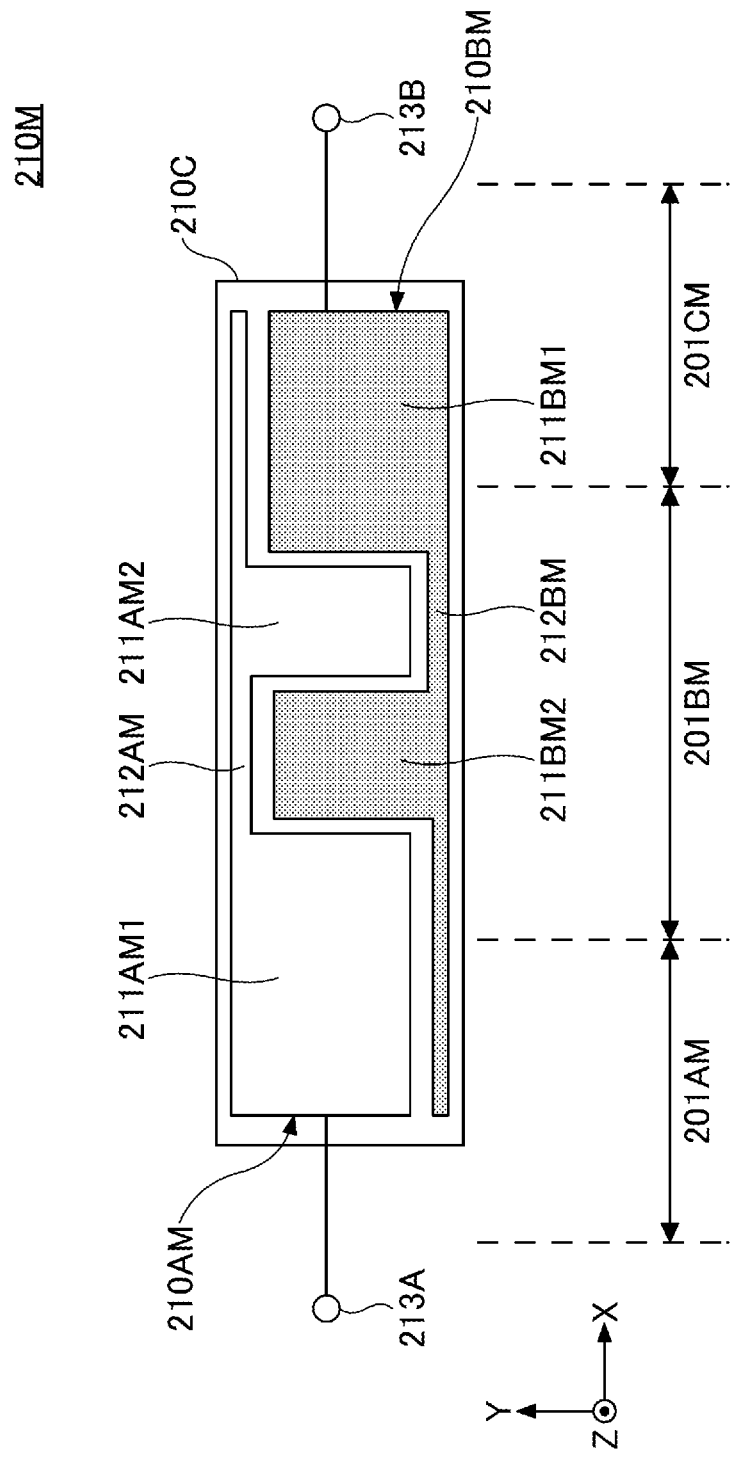
FIG. 19 is a diagram showing an electrostatic sensor according to a modification of embodiment 2.

FIG. 19 is a diagram showing an electrostatic sensor 210M according to a modification of embodiment 2. The electrostatic sensor 210M can be used in the door handle sensor system 200B instead of the electrostatic sensor 210 shown in FIG. 15.

The electrostatic sensor 210M has an electrode 210AM, an electrode 210BM, and a substrate 210C. The electrode 210AM is an example of the first electrode, and the electrode 210BM is an example of the second electrode. Both electrodes 210AM and 210BM have a comb-like shape. The XYZ coordinate system is the same as in embodiment 1. The X direction is an example of the first direction, and the Y direction is an example of the second direction.

The electrode 210AM has a plurality of electrode parts 211AM1 and 211AM2 and a connecting part 212AM, and a terminal 213A is connected. Compared to the electrode 210A shown in FIG. 15, in the electrode 210AM, the width of the +X electrode part 211AM2 in the X direction is wider, and the width of the −X electrode part 211AM1 in the X direction is narrower.

The electrode 210BM has a plurality of electrode parts 211BM1 and 211BM2 and a connecting part 212BM, and a terminal 213B is connected. Compared to the electrode 210B shown in FIG. 15, in the electrode 210BM, the width of the −X electrode part 211BM2 in the X direction is wider, and the width of the +X electrode part 211BM1 in the X direction is narrower.

Note that the substrate 210C is identical to the substrate 210C shown in FIG. 15. Also, in accordance with the widths of the electrode parts 211AM1 and 211AM2 in the X direction and the widths of the electrode parts 211BM1 and 211BM2 in the X direction, the first end section 201AM and the second end section 201CM are made narrower in width in the X direction than the first end section 201A and the second end section 201C shown in FIG. 15, and the center section 201BM is made wider in width in the X direction than the center section 201B.

FIG. 20 is a diagram to show the characteristics of the ratio of the self-capacitances of electrodes 210AM and 210BM versus the positions of fingers on the door handle 201 in the X direction. The characteristics shown in FIG. 20 are determined by an electromagnetic field simulation. As in FIG. 16, the position of fingers in the X direction is the X coordinate of a position between two fingers that neighbor each other in the X direction.

As for the finger position on the door handle 201 in the X direction, as in FIG. 16, the position of the center of the electrostatic sensor 210 in the X direction is 0 mm, the −X direction side is represented by negative values, and the +X direction side is represented by positive values.

Similar to the ratio of self-capacitance shown in FIG. 16, the ratio of self-capacitance in FIG. 20 is the value obtained by dividing the smaller self-capacitance by the larger self-capacitance of the two self-capacitances of the electrodes 210AM and 210BM (smaller self-capacitance/larger self-capacitance). Also, as examples of the self-capacitances of the electrodes 210AM and 210BM, values obtained by digitally converting the values (analog values) detected by the mutual capacitance method are used.

Also, as in FIG. 16, the characteristics of the ratio of self-capacitance are determined for cases in which the fingers were positioned at three different positions in the Z direction, namely the positions 0 mm, 3 mm, and 6 mm away from the surface of the door handle 201 in the −Z direction. The solid line indicates the characteristic in the case of 0 mm, the dashed line indicates the characteristic in the case of 3 mm, and the one-dot chain line indicates the characteristic in the case of 6 mm.

As shown in FIG. 20, although the ratio of self-capacitance varies depending on the height from the surface of the door handle 201, when X=0 mm, the value is substantially the same regardless of the position of fingers in the Z direction. In the section from X=−16.5 mm to X=0 mm and the section from X=0 mm to X=16.5 mm, the ratio of self-capacitance is the largest when the height of fingers is 0 mm. The ratio of self-capacitance was equal when the height of fingers was 3 mm and 6 mm. Also, in the section located further in the −X direction than X=−16.5 mm and the section located further in the +X direction than X=16.5 mm, a tendency was shown in which the ratio of self-capacitance was the smallest when the height of fingers was 0 mm, and the ratio of self-capacitance was the largest at the position 6 mm from the surface.

Thus, it was confirmed that, when the widths of the electrode parts 211AM1, 211AM2, 211BM1, and 211BM2 in the X direction changed, the characteristics of the ratio of self-capacitance with respect to the position of fingers in the X direction also changed. Such an electrostatic sensor 210M may be used instead of the electrostatic sensor 210 shown in FIG. 15, so that it is possible to provide a door handle sensor system 200B that can accurately identify the position at which an operation is performed.

Although examples of embodiments of the electrostatic input device and the door handle sensor system of the present invention have been described above, the present invention is by no means limited to the embodiments disclosed in detail herein, and a variety of modifications and changes can be made without departing from the scope of the claims.

The invention claimed is:
1. A door handle sensor system for mounting in a vehicle, the door handle sensor system comprising:
a door handle device attached to a door of the vehicle; and
a control device configured to control an unlatched state of the door,
wherein the door handle device includes:
an inner case provided inside an outer case provided outside the vehicle;
an electrostatic sensor configured to detect a user coming close to, or in contact with, the outer case or the inner case; and
a pressure sensor configured to detect an operating force applied to the outer case or the inner case,
wherein the control device includes a determining part configured to determine whether a position of an operation by the user is in a first end section, a second end section, or a center section of the outer case and the inner case, the center section being located between the first end section and the second end section,
wherein the control device controls the unlatched state of the door based on a result of determination by the determining part and a value detected by the pressure sensor,
wherein the electrostatic sensor includes:
a first electrode including:
a plurality of first electrode parts arranged at spaced intervals in a first direction, the first direction extending between the first end section and the second end section; and
a first connecting part connecting between the plurality of first electrode parts on a first side in a second direction, the second direction being orthogonal to the first direction in plan view; and
a second electrode including:
a plurality of second electrode parts arranged alternately with the plurality of first electrode parts in the first direction; and
a second connecting part connecting between the plurality of second connecting parts on a second side in the second direction in plan view,
wherein the plurality of first electrode parts are provided only in the first end section and the center section,
wherein the plurality of second electrode parts are provided only in the second end section and the center section, and
wherein one of the plurality of second electrode parts is provided between two adjacent first electrode parts of the plurality of first electrode parts, and one of the plurality of first electrode parts is provided between two adjacent second electrode parts of the plurality of second electrode parts.
2. The door handle sensor system according to claim 1, wherein at least an end part of the endmost first electrode part on a first end section side in the first direction is placed in the first end section, and wherein at least an end part of the endmost second electrode part on a second end section side in the first direction is placed in the second end section.

3. The door handle sensor system according to claim 1, wherein the plurality of first electrode parts include two first electrode parts including a larger first electrode part and a smaller first electrode that is smaller than the larger first electrode part, and the plurality of second electrode parts include two second electrode parts including a larger second electrode part and a smaller second electrode that is smaller than the larger second electrode part, and wherein the larger first electrode part is provided in the first end section, the smaller first electrode part is provided in the central section, the larger second electrode part is provided in the second end section, the smaller second electrode part is provided in the central section, the smaller second electrode part is arranged between the larger first electrode part and the smaller first electrode part, and the smaller first electrode part is arranged between the larger second electrode part and the smaller second electrode part.

4. The door handle sensor system according to claim 3, wherein an area of the first electrode part that is arranged in the center section and an area of the second electrode part that is arranged in the center section are equal, the first electrode part being from among the two first electrode parts and the second electrode part being from among the two second electrode parts.

5. The door handle sensor system according to claim 1, wherein the control device further comprises a switching control part configured to switch the door from a latched state to the unlatched state when the value detected by the pressure sensor is greater than or equal to a threshold, and wherein the switching control part changes a threshold to switch the door between the latched state and the unlatched state in accordance with the result of determination by the determining part.

6. The door handle sensor system according to claim 5, wherein the pressure sensor is provided on a side in the first direction where the endmost first electrode part is located, and wherein the switching control part configures the threshold to be a larger value for detecting the position of the operation by the user in the center section than the threshold value for detecting the position of the operation by the user in the first end section, and configures the threshold to be a larger value for detecting the position of the operation by the user in the second end section than the threshold value for detecting the position of the operation by the user in the center section.

* * * * *